United States Patent
Fukunaga et al.

(10) Patent No.: US 9,534,292 B2
(45) Date of Patent: Jan. 3, 2017

(54) HARD-COATED TOOL AND ITS PRODUCTION METHOD

(71) Applicant: HITACHI TOOL ENGINEERING, LTD., Tokyo (JP)

(72) Inventors: Yuuzoh Fukunaga, Narita (JP); Syuuhou Koseki, Matsue (JP); Kazuyuki Kubota, Narita (JP); Kenichi Inoue, Matsue (JP)

(73) Assignee: Hitachi Tool Engineering, Ltd., Tokyo (JP)

( * ) Notice: Subject to any disclaimer, the term of this patent is extended or adjusted under 35 U.S.C. 154(b) by 0 days.

(21) Appl. No.: 14/428,397

(22) PCT Filed: Sep. 30, 2013

(86) PCT No.: PCT/JP2013/076583
§ 371 (c)(1),
(2) Date: Mar. 16, 2015

(87) PCT Pub. No.: WO2014/054591
PCT Pub. Date: Apr. 10, 2014

(65) Prior Publication Data
US 2015/0240353 A1    Aug. 27, 2015

(30) Foreign Application Priority Data
Oct. 1, 2012  (JP) .................................. 2012-219650

(51) Int. Cl.
*B23B 27/14* (2006.01)
*C23C 16/36* (2006.01)
(Continued)

(52) U.S. Cl.
CPC ............... *C23C 16/36* (2013.01); *C23C 16/30* (2013.01); *C23C 16/32* (2013.01); *C23C 16/34* (2013.01);
(Continued)

(58) Field of Classification Search
USPC .......... 51/307, 309; 428/325, 697, 698, 699, 428/701, 702, 336; 407/119; 427/255.11, 427/255.21, 255.23, 255.391, 255.395
See application file for complete search history.

(56) References Cited

U.S. PATENT DOCUMENTS 5,652,045 A * 7/1997 Nakamura .............. C23C 16/36
51/307
6,221,469 B1 * 4/2001 Ruppi ..................... C23C 16/36
428/697

(Continued)

FOREIGN PATENT DOCUMENTS

| JP | 5-237707 A | 9/1993 |
| JP | 5-263252 A | 10/1993 |

(Continued)

OTHER PUBLICATIONS

International Search Report of PCT/JP2013/076583, dated Nov. 12, 2013. [PCT/ISA/210].

*Primary Examiner* — Archene Turner
(74) *Attorney, Agent, or Firm* — Sughrue Mion, PLLC

(57) ABSTRACT

A hard-coated tool comprising a titanium carbonitride layer formed directly on a WC-based cemented carbide substrate by a chemical vapor deposition method; the titanium carbonitride layer having a composition comprising 74-81% by mass of titanium, 13-16% by mass of carbon and 6-10% by mass of nitrogen; the titanium carbonitride layer having a structure comprising columnar crystal grains having an average transverse cross section diameter of 0.01-0.22 μm; a layer of W diffused from the substrate to the titanium carbonitride layer having an average thickness of 30-200 nm; and the titanium carbonitride layer having an X-ray diffraction peak of a (422) plane in a 2θ range of 122.7-123.7°.

10 Claims, 9 Drawing Sheets

(51) Int. Cl.
   *C23C 16/30*   (2006.01)
   *C23C 16/32*   (2006.01)
   *C23C 16/34*   (2006.01)
   *C23C 30/00*   (2006.01)
   *C23C 16/44*   (2006.01)

(52) U.S. Cl.
   CPC ............. *C23C 16/44* (2013.01); *C23C 30/005* (2013.01); *Y10T 428/24975* (2015.01); *Y10T 428/256* (2015.01)

(56) References Cited

U.S. PATENT DOCUMENTS

| | | | |
|---|---|---|---|
| 7,192,660 B2 * | 3/2007 | Ruppi | C23C 16/36 428/325 |
| 7,906,230 B2 | 3/2011 | Watanabe et al. | |
| 8,323,738 B2 | 12/2012 | Watanabe et al. | |
| 2004/0106016 A1 * | 6/2004 | Okada | C23C 16/30 407/119 |
| 2006/0222885 A1 * | 10/2006 | Fukano | C23C 30/005 428/698 |
| 2008/0057280 A1 * | 3/2008 | Watanabe | C23C 16/36 428/698 |
| 2010/0330360 A1 * | 12/2010 | Tanibuchi | C23C 16/0272 428/332 |
| 2011/0135822 A1 | 6/2011 | Watanabe et al. | |

FOREIGN PATENT DOCUMENTS

| | | |
|---|---|---|
| JP | 9-262705 A | 10/1997 |
| JP | 2000-355777 A | 12/2000 |
| JP | 2001-322008 * | 11/2001 |
| JP | 3503658 B2 | 3/2004 |
| JP | 2005-153098 * | 6/2005 |
| JP | 2006-231433 A | 9/2006 |
| JP | 2008-87150 A | 4/2008 |
| JP | 4534790 B2 | 9/2010 |
| JP | 2011-36988 A | 2/2011 |
| JP | 4720283 B2 | 7/2011 |

* cited by examiner 400,000 Times 170,000 Times

US 9,534,292 B2

HARD-COATED TOOL AND ITS PRODUCTION METHOD

CROSS REFERENCE TO RELATED APPLICATIONS

This application is a National Stage of International Application No. PCT/JP2013/076583 filed Sep. 30, 2013, claiming priority based on Japanese Patent Application No. 2012-219650, filed Oct. 1, 2012, the contents of all of which are incorporated herein by reference in their entirety.

FIELD OF THE INVENTION

The present invention relates to a hard-coated tool having excellent wear resistance and chipping resistance, and its production method.

BACKGROUND OF THE INVENTION

Surface-coated cutting tools having single-layer or multi-layer hard coatings of TiC, TiN, TiCN, $Al_2O_3$, etc. on the surfaces of cemented carbide substrates have been conventionally used to cut works. When such surface-coated tools are used to cut difficult-to-cut alloys such as Ni-based heat-resistant alloys such as Inconel (registered trademark), heat-resistant stainless steel, etc., cutting edges are chipped due to the work hardening of difficult-to-cut alloys by cutting; hard coatings are peeled by the repeated detachment of difficult-to-cut alloys seized to the cutting edges; and the substrate matrix are destroyed by the peeling of the hard coatings. Therefore, cutting tools having hard coatings excellent not only in wear resistance but also in chipping resistance are desired.

JP 9-262705 A discloses a coated cutting tool comprising a first layer constituted by a reacted solid solution of TiN having a granular crystal structure and substrate components, and a second layer constituted by a reacted solid solution of columnar crystal TiCN and substrate components, on a WC-based cemented carbide substrate. It has been found, however, that because the TiN film is formed at 920° C. using a starting material gas comprising a $TiCl_4$ gas, a $N_2$ gas, and a $H_2$ gas in JP 9-262705 A, the starting material gas is excessively reacted with the substrate, excessively diffusing W in the substrate, resulting in a brittle layer under the first layer, and thus poor chipping resistance.

Japanese Patent 3503658 discloses a coated cutting tool comprising a lower layer of TiC or TiCN, an intermediate layer of columnar crystal TiCN, and an upper layer of TiC or TiCNO on a WC-based cemented carbide substrate, any of the lower layer, the intermediate layer and the upper layer containing 0.01-6% by mass of Co coming from the substrate. However, because the lower layer, the intermediate layer and the upper layer contain too much Co, the hard coating has low hardness and thus insufficient wear resistance. It has also been found that because Co and W are excessively diffused from the substrate, a brittle layer is formed, resulting in poor chipping resistance.

JP 2011-36988 A discloses a coated cemented carbide tool comprising a first layer (TiC film) and a second layer (columnar crystal TiCN film) formed on a WC-based cemented carbide substrate, the amounts $Cr_{L1}$, $Co_{L1}$ of Cr and Co diffused from the substrate to the first layer meeting the conditions of $0.1 \leq Cr_{L1} \leq 0.6$ by % by mass, and $0.6 \leq Cr_{L1}/Co_{L1} \leq 1.6$. It has been found, however, that because the first layer of TiC is formed at 930° C. or higher using a starting material gas comprising a $TiCl_4$ gas, a $CH_4$ gas, and a $H_2$ gas in JP 2011-36988 A, substrate components are excessively diffused to the first layer, resulting in poor chipping resistance.

JP 2008-87150 A discloses a coated cutting tool comprising a TiN film; a columnar crystal TiCN film having an average crystal diameter of 0.05-0.5 μm when measured in parallel with the substrate surface, and an X-ray diffraction peak of a (422) plane in a 2θ range of 121.5-122.6° (CuKα); an aluminum oxide film; and a TiN film successively formed on a WC-based cemented carbide substrate. In the columnar crystal TiCN film, $C/(C+N)$ is 0.70-0.90. Because the TiN film is formed directly on the substrate in JP 2008-87150 A, substrate components are largely diffused to the first layer, resulting in poor chipping resistance. Further, because the starting material gas for the columnar crystal TiCN film contains a $TiCl_4$ gas, an $CH_3CN$ gas, a $H_2$ gas, and an $C_2H_6$ gas, without a $N_2$ gas, fine, columnar TiCN crystal grains do not uniformly grow, but coarse TiCN crystal grains are formed, resulting in poor chipping resistance.

Japanese Patent 4720283 discloses a coated cutting tool comprising a modified titanium carbonitride layer vapor-deposited on a WC-based cemented carbide tool substrate. The modified titanium carbonitride layer comprises a conventional TiCN layer formed on a TiCN film having an average thickness of 0.02-0.5 μm. The starting material gas for the TiCN film comprises $TiCl_4$, $C_3H_6$, $N_2$ and $H_2$. When a conventional TiCN layer (thickness: 1 μm) as the first layer and a TiCN film as the second layer were formed directly on the WC-based cemented carbide tool substrate C, the coated cutting tool has a short tool life, because the conventional TiCN film has poor wear resistance and low adhesion to the substrate.

Japanese Patent 4534790 discloses a cutting tool comprising lower and upper layers formed on a substrate, the lower layer being a Ti compound layer (comprising a modified TiCN layer) having an average thickness of 3-20 μm, and the upper layer being a chemical-vapor-deposited aluminum oxide layer having an average thickness of 1-15 μm. The modified TiCN layer is formed by a usual chemical vapor deposition apparatus, using a starting material gas comprising $TiCl_4$, $CH_3CN$, $C_2H_4$, $N_2$ and $H_2$, under the conditions of a substrate temperature of 700-750° C. and a pressure of 25-40 kPa. However, the inventors' investigation has revealed that because Japanese Patent 4534790 uses $C_2H_4$ having remarkably higher reactivity to a WC-based cemented carbide substrate than the starting material gas ($C_2H_6$) in the present invention, W is excessively diffused from the substrate, resulting in poor chipping resistance. It has also been found that because the starting material gas pressure is 25-40 kPa, higher than the starting material gas pressure (5-10 kPa) for the TiCN layer in the present invention, fine columnar TiCN crystal grains do not uniformly grow, but coarse TiCN crystal grains are formed, resulting in poor chipping resistance.

OBJECTS OF THE INVENTION

Accordingly, an object of the present invention is to provide a hard-coated tool having excellent chipping resistance and wear resistance.

Another object of the present invention is to provide a method for producing such a hard-coated tool.

DISCLOSURE OF THE INVENTION

The first hard-coated tool of the present invention comprises a hard coating comprising a titanium carbonitride layer formed directly on a WC-based cemented carbide substrate by a chemical vapor deposition method, (a) the titanium carbonitride layer having a composition comprising 74-81% by mass of titanium, 13-16% by mass of carbon and 6-10% by mass of nitrogen;

(b) the titanium carbonitride layer having a columnar crystal structure comprising columnar crystal grains having an average transverse cross section diameter of 0.01-0.22 μm;

(c) a layer of W diffused from the substrate to the titanium carbonitride layer having an average thickness in a range of 30-200 nm; and (d) the titanium carbonitride layer having an X-ray diffraction peak of a (422) plane in a 2θ range of 122.7-123.7°.

With a suitable C/N range expressed by 2θ in the above composition range, with columnar crystal grains constituting the titanium carbonitride layer as fine as having an average transverse cross section diameter of 0.01-0.22 μm, and with a W-diffused layer in a suitable average thickness range of 30-200 nm, the titanium carbonitride layer has sufficient adhesion to the substrate while suppressing embrittlement of the substrate, and exhibiting excellent chipping resistance in cutting difficult-to-cut materials.

The titanium carbonitride layer preferably has an average thickness of 1-8 μm.

In the W-diffused layer, crystal grain boundaries preferably have a composition represented by $(Ti_{x_1}, W_{y_1}, Co_{z_1})(C, N)$, wherein $x_1=0.20-0.75$, $y_1=0.2-0.6$, $z_1=0.05-0.20$, and $x_1+y_1+z_1=1$ by a mass ratio, and crystal grains preferably have a composition represented by $(Ti_{x_2}, W_{y_2}, Co_{z_2})(C, N)$, wherein $x_2=0.55-1$, $y_2=0-0.3$, $z_2=0-0.15$, and $x_2+y_2+z_2=1$ by a mass ratio. Thus, W and Co are diffused in crystal grain boundaries, but the diffusion of W and Co in crystal grains is remarkably suppressed by crystal grain boundaries.

The second hard-coated tool of the present invention comprises a titanium nitride layer having an average thickness of 0.5-4 μm as a second layer directly on the above titanium carbonitride layer as the first layer; the second layer having a composition comprising 76-85% by mass of titanium, 10-14% by mass of carbon and 5-10% by mass of nitrogen, and a columnar crystal structure.

Each of the first and second hard-coated tools of the present invention is preferably an insert.

The method of the present invention for producing the first hard-coated tool comprises forming the titanium carbonitride layer directly on the WC-based cemented carbide substrate at 800-880° C. by a chemical vapor deposition method, using a starting material gas comprising a $TiCl_4$ gas, a $N_2$ gas, an $CH_3CN$ gas, an $C_2H_6$ gas, and a $H_2$ gas.

The starting material gas preferably comprises 1-3% by volume of a $TiCl_4$ gas, 5-30% by volume of a $N_2$ gas, 0.1-1.5% by volume of an $CH_3CN$ gas, and 0.5-2.5% by volume of an $C_2H_6$ gas, the balance being a $H_2$ gas. The starting material gas may contain a $CH_4$ gas in a proportion of less than 50% by volume of the $C_2H_6$ gas.

The starting material gas preferably has a pressure of 5-10 kPa.

The method of the present invention for producing the second hard-coated tool comprises forming a titanium carbonitride layer having a composition comprising 76-85% by mass of titanium, 10-14% by mass of carbon and 5-10% by mass of nitrogen, and having a columnar crystal structure and an average thickness of 0.5-4 μm as a second layer, directly on the same titanium carbonitride layer (first layer) as in the first hard-coated tool at a substrate temperature of 800-880° C., by a chemical vapor deposition method, using a starting material gas comprising a $TiCl_4$ gas, a $N_2$ gas, an $CH_3CN$ gas, and a $H_2$ gas.

DESCRIPTION OF THE PREFERRED EMBODIMENTS

[1] First Hard-Coated Tool

Figure 1:
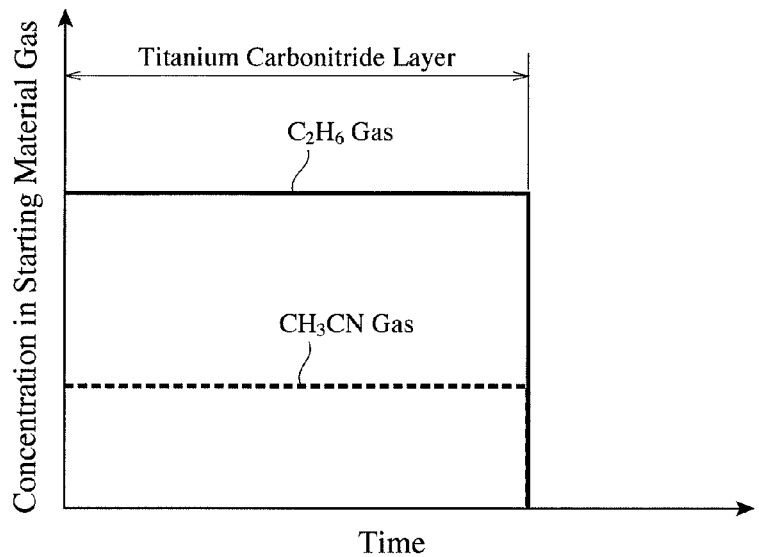
FIG. 1 is a graph schematically showing the concentration changes of an $C_2H_6$ gas, and an $CH_3CN$ gas in the starting material gas when a titanium carbonitride layer for the first hard-coated tool is formed.

The first hard-coated tool of the present invention comprises a titanium carbonitride layer directly formed on a WC-based cemented carbide substrate by a chemical vapor deposition method. The titanium carbonitride layer has a composition comprising 74-81% by mass of titanium, 13-16% by mass of carbon and 6-10% by mass of nitrogen, and has a columnar crystal structure. The titanium carbonitride layer has a columnar crystal structure composed of columnar crystal grains having an average transverse cross section diameter of 0.01-0.22 μm, a layer of W diffused from the substrate to the titanium carbonitride layer having an average thickness in a range of 30-200 nm. A (422) plane of the titanium carbonitride layer has an X-ray diffraction peak in a 2θ range of 122.7-123.7°.

(A) Substrate

From the aspect of strength, hardness, wear resistance, toughness, thermal stability, etc., the substrate is made of WC-based cemented carbide. The WC-based cemented carbide is preferably composed of tungsten carbide (WC) particles, and a bonding phase of Co or a Co-based alloy. The bonding phase is preferably 1-13.5% by mass, more preferably 3-13% by mass. When the bonding phase is less than 1% by mass, the substrate has insufficient toughness. When the bonding phase is more than 13.5% by mass, the substrate has insufficient hardness (wear resistance). The titanium carbonitride layer of the present invention may be formed on any of unground surfaces, ground surfaces and cutting edge surfaces of the sintered WC-based cemented carbide. Though a titanium carbonitride layer formed on an unground (as-sintered) substrate has sufficiently high hardness and wear resistance, a titanium carbonitride layer formed on a ground substrate surface or a cutting edge surface of the substrate has higher hardness and wear resistance because of finer crystal grains.

(B) Titanium Carbonitride Layer

When difficult-to-cut alloys such as Ni-based heat-resistant alloys like Inconel (registered trademark), heat-resistant stainless steels, etc. are cut, a work is likely seized to a hard coating of an insert, resulting in peeling of the hard coating. Accordingly, the hard coating should have high adhesion to the WC-based cemented carbide substrate. Though a layer of TiN or TiC has conventionally been formed as a primer layer, the formation of such layer needs exposure of the substrate to a temperature higher than 900° C. for a long period of time, forming a decarburized layer in an interface between the substrate and the TiN layer, making the substrate brittle. It was thus proposed to from a TiCN film by using a $TiCl_4$ gas, an $CH_3CN$ gas, and a $H_2$ gas. However, because it has low adhesion to the substrate, a film-forming temperature should be higher than 900° C. for higher adhesion to the substrate, resulting in excessive diffusion of W and Co, substrate components. In the present invention, therefore, a titanium carbonitride layer is formed, using a $TiCl_4$ gas, an $CH_3CN$ gas, an $C_2H_6$ gas having low reactivity to the substrate, a $N_2$ gas suppressing the reactivity of an $C_2H_6$ gas to reduce the diffusion of substrate components to the titanium carbonitride layer, and a $H_2$ gas, as a starting material gas as described below. The use of such starting material gas makes it possible to control a substrate temperature to 800-880° C. when a titanium carbonitride layer is formed, thereby controlling the average thickness of a W-diffused layer in a range of 30-200 nm. Thus, a hard-coated tool having excellent wear resistance and chipping resistance is obtained.

The titanium carbonitride layer having a columnar structure comprises 74-81% by mass of titanium, 13-16% by mass of carbon and 6-10% by mass of nitrogen, as Ti+C+N=100% by mass. The composition of the titanium carbonitride layer was determined based on the measurement results of EPMA, EDS and AES described later. When the carbon concentration in the titanium carbonitride layer is less than 13% by mass, sufficient diffusion of a component (W) in the WC-based cemented carbide substrate to the titanium carbonitride layer does not occur, resulting in low adhesion of the titanium carbonitride layer to the substrate. As a result, the titanium carbonitride layer is easily peelable, resulting in low chipping resistance. When the carbon concentration is more than 16% by mass, excessive diffusion of a substrate component occurs to form a brittle layer under the titanium carbonitride layer, drastically reducing the chipping resistance of the titanium carbonitride layer.

When the nitrogen concentration in the titanium carbonitride layer is less than 6% by mass, the titanium carbonitride layer is brittle because of low toughness, resulting in low chipping resistance. When the nitrogen concentration is more than 10% by mass, the titanium carbonitride layer has low hardness and thus low wear resistance. An atomic ratio of the carbon concentration C to the total of the carbon concentration C and the nitrogen concentration N in the titanium carbonitride layer, which is expressed by C/(C+N), is preferably 0.61-0.73. With the C/(C+N) ratio of less than 0.61 or more than 0.73, the chipping resistance tends to be low.

In the titanium carbonitride layer, columnar crystal grains have an average transverse cross section diameter of 0.01-0.22 μm, preferably 0.05-0.20 μm. The "average transverse cross section diameter" is an average diameter of cross sections of columnar crystal grains in a plane in parallel with the substrate surface. The titanium carbonitride layers with an average transverse cross section diameter of less than 0.01 μm are difficult to industrially produce, and those more than 0.22 μm have drastically reduced hardness, thereby having low wear resistance.

In the titanium carbonitride layer, an X-ray diffraction peak of a (422) plane is in a range of 2θ=122.7-123.7°. X-ray diffraction measurement conditions are described later. The peak position of a (422) plane changes depending on the amounts of carbon and nitrogen and the diameters of crystal grains in the titanium carbonitride layer. When the X-ray diffraction peak position 2θ is below 122.7°, the titanium carbonitride layer contains too much carbon, so that carbon is diffused to and concentrated in the substrate, and that excessive carbon remains as free carbon on the substrate and the titanium carbonitride layer without reacting with metal components in the starting material gas, providing the titanium carbonitride layer with low adhesion and toughness. Thus, the titanium carbonitride layer has low chipping resistance. When the X-ray diffraction peak position 2θ is above 123.7°, the titanium carbonitride layer contains too much nitrogen, resulting in low film hardness and wear resistance.

To have excellent wear resistance and chipping resistance, the titanium carbonitride layer preferably has an average thickness of 1-8 μm. With an average thickness of less than 1 μm, it has low wear resistance. The titanium carbonitride layer as thick as more than 8 μm has low chipping resistance. When a difficult-to-cut material is turning-cut by the hard-coated tool of the present invention, the titanium carbonitride layer more preferably has an average thickness of 2-5 μm. In turning, the peeling of the coating and the chipping of the substrate likely occur. However, with the titanium carbonitride layer having an average thickness of 2-5 μm, the chipping resistance is remarkably improved.

The hardness of the titanium carbonitride layer measured by a nano-indentation method is preferably 30-38 GPa, more preferably 32-36 GPa. With hardness of less than 30 GPa, the titanium carbonitride layer has poor wear resistance. With hardness of more than 38 GPa, the titanium carbonitride layer has too high carbon concentration, resulting in more diffusion of W from the substrate to the titanium carbonitride layer, so that the titanium carbonitride layer becomes brittle.

(C) Diffused Layer

While the titanium carbonitride layer is formed, W and Co, basic components of the WC-based cemented carbide are diffused from the substrate to the titanium carbonitride layer, together with C in the substrate. With too much W and Co diffused, a brittle layer is formed in the substrate, resulting in low chipping resistance. W and Co are not diffused alone, and the controlled diffusion of W is accompanied by the controlled diffusion of Co. Excessive diffusion of Co to the titanium carbonitride layer provides the titanium carbonitride layer with low hardness and wear resistance.

A layer to which W is diffused (called simply "W-diffused layer") may contain a certain amount of Co, and has an average thickness in a range of 30-200 nm. When the average thickness of the W-diffused layer is less than 30 nm, the diffusion of W to the titanium carbonitride layer is insufficient, resulting in insufficient adhesion of the titanium carbonitride layer to the substrate. Further, chipping occurs with peeled portions of the titanium carbonitride layer as starting points, resulting in low chipping resistance. When the average thickness of the W-diffused layer is more than 200 nm, the diffusion of W is excessive, resulting in the formation of a brittle layer below the titanium carbonitride layer, thereby providing the titanium carbonitride layer with low chipping resistance. The average thickness of the W-diffused layer can be controlled by the composition and pressure of a starting material gas, the substrate temperature and the film-forming time.

In the above diffused layer, crystal grain boundaries of titanium carbonitride have a composition represented by $(Ti_{x_1}, W_{y_1}, Co_{z_1})(C, N)$, wherein $x_1=0.20-0.75$, $y_1=0.2-0.6$, $z_1=0.05-0.2$, and $x_1+y_1+z_1=1$ by mass ratio, and titanium carbonitride crystal grains have a composition represented by $(Ti_{x_2}, W_{y_2}, Co_{z_2})(C, N)$, wherein $x_2=0.55-1$, $y_2=0-0.3$, $z_2=0-0.15$, and $x_2+y_2+z_2=1$ by mass ratio. With the compositions of crystal grain boundaries and crystal grains failing to meet the above requirements, the diffusion of W and Co, substrate components, to the titanium carbonitride layer is insufficient or excessive. In the case of insufficient diffusion, the titanium carbonitride layer has low adhesion to the substrate, resulting in increased chipping with portions of the titanium carbonitride layer peeling from the substrate acting as starting points, and thus low chipping resistance. In the case of excessive diffusion, the substrate becomes brittle with low toughness, providing the titanium carbonitride layer with low chipping resistance.

With the above crystal grain boundary composition, the amounts of W and Co diffused mainly through crystal grain boundaries to the titanium carbonitride layer can be suppressed. When W and Co are excessively diffused to the crystal grains, the titanium carbonitride layer is provided with low hardness, and W and Co diffused mainly through crystal grain boundaries to the titanium carbonitride layer are diffused as deep as more than 200 nm in the titanium carbonitride layer in a film-forming direction, resulting in low chipping resistance. The diffusion distance of W and Co in crystal grain boundaries and crystal grains can be controlled by the starting material gas composition, substrate temperature and starting material gas pressure during the formation of the titanium carbonitride layer, and the time period of forming the titanium carbonitride layer.

[2] Second Hard-Coated Tool (A) Second Layer in Titanium Carbonitride Layer

The second hard-coated tool comprises a titanium carbonitride layer formed as a second layer directly on the first layer of titanium carbonitride in the first hard-coated tool. The second layer has a composition comprising 76-85% by mass of titanium, 10-14% by mass of carbon and 5-10% by mass of nitrogen (Ti+C+N=100% by mass), and a columnar crystal structure. Like the first layer, the composition of the second layer is measured by EPMA, EDS and AES.

When the second layer has a carbon concentration of less than 10% by mass, it does not have sufficient hardness and wear resistance. When the second layer has a carbon concentration of more than 14% by mass, the titanium carbonitride layer has increased defects and free carbon, suffering poor chipping resistance. The carbon concentration is preferably 0.1% or more by mass lower in the second layer than in the first layer. With the carbon concentration lower in the second layer than in the first layer, higher adhesion is achieved between the second layer and an upper layer formed thereon, resulting in higher chipping resistance. To make the carbon concentration 0.1% or more by mass lower in the second layer than in the first layer, a starting material gas for the second layer does not contain an $C_2H_6$ gas, but comprises a $TiCl_4$ gas, a $N_2$ gas, an $CH_3CN$ gas, and a $H_2$ gas.

The second layer preferably has a nitrogen concentration of 5-10% by mass. The second layer does not have sufficient toughness at the nitrogen concentration of less than 5% by mass, and low wear resistance at the nitrogen concentration of more than 10% by mass. In the second layer, an atomic ratio [C/(C+N)] of the carbon concentration C to the total (C+N) of the carbon concentration C and the nitrogen concentration N is preferably 0.50-0.60. When C/(C+N) is less than 0.50 or more than 0.60, the second layer tends to have deteriorated wear resistance and chipping resistance.

The second layer is preferably formed continuously with the first layer. When formed continuously, the second layer has high hardness and wear resistance because fine columnar crystals are formed. In the second layer, columnar crystal grains preferably have an average transverse cross section diameter of 0.01-0.5 μm. Those having an average transverse cross section diameter of less than 0.01 μm are difficult to industrially produce, and those more than 0.5 μm have drastically reduced hardness.

The second layer preferably has an average thickness of 0.5-4 μm. The average thickness of less than 0.5 μm provides low toughness and a short life, and the average thickness of more than 4 μm provides drastically lowered chipping resistance.

The hardness of the second layer measured by a nanoindentation method is preferably 29-38 GPa, more preferably 31-36 GPa. The second layer has low wear resistance at hardness of less than 29 GPa, and is brittle with low chipping resistance at hardness of more than 38 GPa because of too high a carbon concentration.

(C) Upper Layer

Formed on the first or second layer as an upper layer is preferably (a) a single- or multi-layer hard film indispensably comprising at least one metal element selected from the group consisting of Ti, Cr, Al, Si, V, B and Zr, and at least one non-metal element selected from the group consisting of C, N and O, or (b) an oxide layer of Al and/or Cr. In the case (b), a bonding layer is preferably formed between the second layer and the oxide layer. The upper layer (a) is called a first upper layer, and the upper layer (b) is called a second upper layer.

(1) First Upper Layer

The first upper layer preferably comprises Ti and C, and N and/or O as indispensable elements, and at least one element selected from the group consisting of Al, Cr, Si, V, B and Zr as an optional element, and has mainly a face-center cubic (fcc) crystal structure like the first and second layers. Specific examples of the first upper layer are TiC, CrC, SiC, VC, ZrC, TiN, AlN, TiBN, $Si_3N_4$, CrN, VN, ZrN, TiAlN, TiCrN, TiSiN, TiVN, TiZrN, TiCN, TiAlCN, TiCrCN, TiSiCN, TiVCN, TiZrCN, TiBCN, TiCNO, TiAlCNO, TiCrCNO, TiSiCNO, TiZrCNO, TiVCNO, TiCO, TiAlCO, TiCrCO, TiSiCO, TiVCO, TiZrCO, $TiB_2$, etc.

(2) Second Upper Layer (a) Bonding Layer

The bonding layer formed on the second layer by a chemical vapor deposition method is a single- or multi-layer hard coating indispensably comprising at least one metal element selected from the group consisting of Ti, Al, B and Zr, and at least one non-metal element selected from the group consisting of C, N and O. This bonding layer is formed to strongly bond an oxide layer of Al and/or Cr to the first or second layer. To exhibit high adhesion, the bonding layer preferably has a multi-layer structure comprising a Ti(CN) layer having the same crystal structure as in the first or second layer, and a Ti(CNO), Ti(CO), (TiAl)(CNO) or (TiB)(CNO) layer having high adhesion to the oxide layer.

(b) Oxide Layer of Al and/or Cr

Figure 13A:
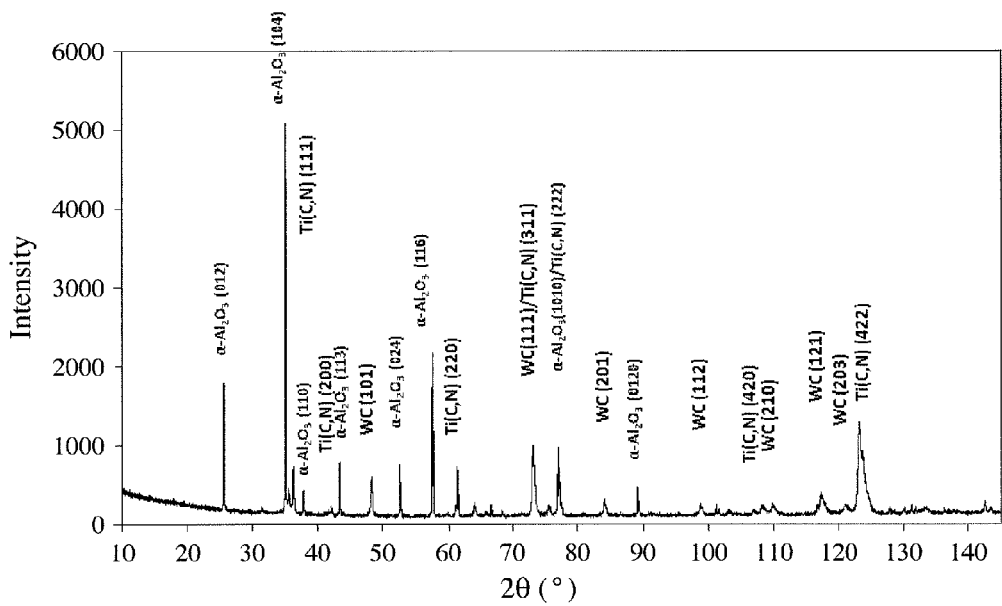
FIG. 13(a) is a graph showing an X-ray diffraction pattern of the hard coating of Example 39 comprising a titanium carbonitride layer, a bonding layer and an aluminum oxide layer.

An oxide layer of Al and/or Cr is formed directly on the bonding layer by a chemical vapor deposition method. In the oxide layer of Al and/or Cr (aluminum oxide, chromium oxide or aluminum chromium oxide layer), 10 atomic % or less in total of Al and/or Cr may be substituted by at least one element of Zr and Ti, if necessary. The oxide layer has preferably an α-type main structure, more preferably an α-single structure [only α-type X-ray diffraction pattern observed as shown in FIG. 13(a)]. To exhibit sufficient heat resistance and oxidation resistance, the average thickness of the oxide layer is preferably 0.5-8 μm, more preferably 1-6 μm, most preferably 2-4 μm. The oxide layer has a short life at an average thickness of less than 0.5 μm, and drastically lowered adhesion at an average thickness of more than 8 μm.

[3] Production Method

The first and second hard coatings are formed by a chemical vapor deposition method, using a thermal or plasma-assisted chemical vapor deposition apparatus (called simply "CVD furnace"). Taking a thermal chemical vapor deposition method for example, the method of the present invention will be explained below. Of course, the present invention is not restricted thereto, but any other chemical vapor deposition methods may be used.

(A) Production Method of First Hard-Coated Tool

With a $H_2$ gas, a $N_2$ gas and/or an Ar gas supplied to a CVD furnace, in which WC-based cemented carbide substrates are set, the substrates are heated to a temperature of 800-880° C. Thereafter, a starting material gas comprising a $TiCl_4$ gas, a $N_2$ gas, an $CH_3CN$ gas, an $C_2H_6$ gas, and a $H_2$ gas is supplied to a CVD furnace to form the titanium carbonitride layer.

(1) Starting Material Gas

As schematically shown in FIG. 1, the concentration of an $C_2H_6$ gas is higher than that of an $CH_3CN$ gas in the starting material gas. With the amounts of an $C_2H_6$ gas and/or an $CH_3CN$ gas continuously or stepwise increased, the concentration of an $C_2H_6$ gas may be finally higher than that of an $CH_3CN$ gas. A specific composition of the starting material gas preferably comprises 1-3% by volume of a $TiCl_4$ gas, 5-30% by volume of a $N_2$ gas, 0.1-1.5% by volume of an $CH_3CN$ gas, and 0.5-2.5% by volume of an $C_2H_6$ gas, the balance being a $H_2$ gas, with their total being as 100% by volume. The starting material gas may contain a $CH_4$ gas in a proportion of less than 50% by volume of an $C_2H_6$ gas. With a lower ratio of a $CH_4$ gas to an $C_2H_6$ gas, the resultant titanium carbonitride layer tends to have higher hardness and wear resistance. Accordingly, the ratio of a $CH_4$ gas to an $C_2H_6$ gas is preferably 30% or less by volume, more preferably 20% or less by volume, most preferably substantially 0% by volume.

Less than 1% by volume of a $TiCl_4$ gas forms a non-uniform titanium carbonitride layer with increased defects and low chipping resistance. With more than 3% by volume of a $TiCl_4$ gas, the starting material gas excessively reacts with the substrate, resulting in low chipping resistance because of a brittle layer formed therebetween.

With less than 5% by volume of a $N_2$ gas, the starting material gas excessively reacts with the substrate, resulting in low chipping resistance because of a brittle layer formed therebetween. As a $N_2$ gas becomes more than 30% by volume, reaction components are diluted, forming a non-uniform titanium carbonitride layer with increased defects and low chipping resistance.

With less than 0.1% by volume of an $CH_3CN$ gas, a reaction speed is low, taking much time to form the titanium carbonitride layer. As a result, a brittle layer is formed in the substrate, lowering the chipping resistance. With more than 1.5% by volume of an $CH_3CN$ gas, a growing speed is high, making crystal grains coarser, and thus lowering the chipping resistance.

With less than 0.5% by volume of an $C_2H_6$ gas, the titanium carbonitride layer has an insufficient carbon concentration, resulting in low hardness and poor wear resistance. With more than 2.5% by volume of an $C_2H_6$ gas, the starting material gas excessively reacts with the substrate, resulting in a brittle layer formed therebetween, which lowers the chipping resistance.

(2) Film-Forming Conditions

The substrate temperature is 800-880° C., preferably 810-870° C., more preferably 820-860° C., during film formation. At the substrate temperature of lower than 800° C., chlorine in the starting material gas excessively remains in the titanium carbonitride layer, resulting in low wear resistance. At the substrate temperature of higher than 880° C., the starting material gas excessively reacts with the substrate, resulting in a brittle layer formed therebetween, which lowers the chipping resistance. The substrate temperature is measured by a thermocouple embedded in a substrate-supporting holder in the CVD furnace.

The starting material gas preferably has a pressure of 5-10 kPa. When the pressure of the starting material gas is lower than 5 kPa, it is impossible to obtain a titanium carbonitride layer having high adhesion to the substrate. On the other hand, the starting material gas pressure exceeding 10 kPa makes crystal grains in the titanium carbonitride layer coarser, resulting in low wear resistance.

(B) Production Method of Second Hard-Coated Tool (1) Formation of Titanium Carbonitride Layer as Second Layer (a) Starting Material Gas With the same titanium carbonitride layer as in the first hard-coated tool as a first layer, a starting material gas supplied to the CVD furnace is preferably changed to that for the second layer to continuously form a second layer.

Figure 2:
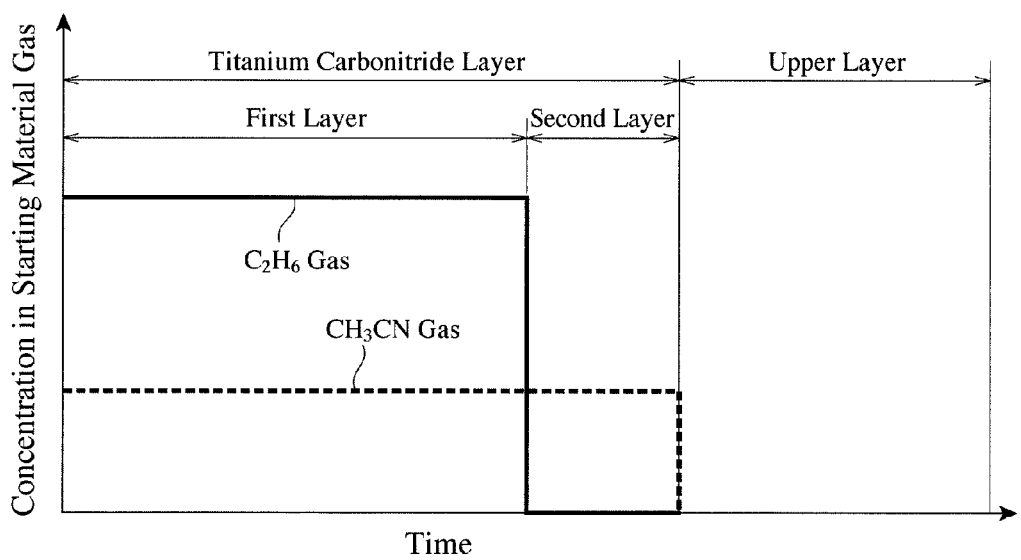
FIG. 2 is a graph schematically showing the concentration changes of an $C_2H_6$ gas, and an $CH_3CN$ gas in the starting material gas when the first and second layers of titanium carbonitride for the second hard-coated tool are formed.

Thus, fine columnar crystals continuously grow, resulting in a titanium carbonitride layer having high adhesion between the first layer and the second layer. As shown in FIG. 2, a starting material gas for the second layer comprises a $TiCl_4$ gas, a $N_2$ gas, an $CH_3CN$ gas, and $H_2$ gas, without an $C_2H_6$ gas. As a result, the carbon concentration in the second layer can be 0.1% or more by mass lower than in the first layer, resulting in high adhesion of the second layer to the first layer. With the second layer continuously formed with the first layer, columnar crystal grains can be suppressed to be coarser, keeping high hardness and wear resistance. Because of a lower carbon concentration than in the first layer of the titanium carbonitride layer, the second layer has improved adhesion to an immediately above first upper layer.

A specific composition of the starting material gas for the second layer preferably comprises 1-3% by volume of a $TiCl_4$ gas, 5-30% by volume of a $N_2$ gas, and 0.3-2% by volume of an $CH_3CN$ gas, the balance being a $H_2$ gas, with their total being as 100% by volume. Less than 1% by volume of a $TiCl_4$ gas provides a low film-forming speed, resulting in a titanium carbonitride layer with increased defects and low chipping resistance. More than 3% by volume of a $TiCl_4$ gas makes columnar crystals coarser, resulting in low chipping resistance.

Less than 5% by volume of a $N_2$ gas provides a titanium carbonitride layer with too low nitrogen concentration, increased defects and low chipping resistance. When a $N_2$ gas is more than 30% by volume, a uniform titanium carbonitride layer cannot be obtained.

With less than 0.3% by volume of an $CH_3CN$ gas, a film-forming speed is too low, and a uniform titanium carbonitride layer cannot be obtained. With more than 2% by volume of an $CH_3CN$ gas, columnar crystal grains become coarser, resulting in low wear resistance.

(b) Film-Forming Conditions

While the second layer is formed, the substrate temperature is preferably 800-880° C., more preferably 810-870° C., most preferably 820-860° C. The substrate temperature of lower than 800° C. provides too high a film-forming speed, having chlorine in the starting material gas remain in the second layer, resulting in low wear resistance. The film-forming temperature higher than 880° C. causes the starting material gas to excessively react with the substrate, making crystal grains coarser, thereby resulting in low wear resistance.

While the second layer is formed, the starting material gas preferably has a pressure of 5-10 kPa. The starting material gas pressure of less than 5 kPa fails to provide a uniform titanium carbonitride layer. When the starting material gas pressure exceeds 10 kPa, crystal grains become coarser, resulting in low wear resistance.

(2) Formation of First Upper Layer

A first upper layer having high adhesion to the second layer (high adhesion to the first layer, when the first upper layer is formed directly on the first layer) can be formed by a known chemical vapor deposition method. The film-forming temperature may be 700-1150° C. Examples of starting material gases for the first upper layer are as described below.

1. TiC film: a $TiCl_4$ gas, a $CH_4$ gas, and a $H_2$ gas.
2. CrC film: a $CrCl_3$ gas, a $CH_4$ gas, and a $H_2$ gas.
3. SiC film: a $SiCl_4$ gas, a $CH_4$ gas, and a $H_2$ gas.
4. VC film: a $VCl$ gas, a $CH_4$ gas, and a $H_2$ gas.
5. ZrC film: a $ZrCl_4$ gas, a $CH_4$ gas, and a $H_2$ gas.
6. TiN film: a $TiCl_4$ gas, a $N_2$ gas, and a $H_2$ gas.
7. AlN film: an $AlCl_3$ gas, an $NH_4$ gas, and a $H_2$ gas.
8. CrN film: a $CrCl_3$ gas, an $NH_4$ gas, and a $H_2$ gas.
9. $Si_3N_4$ film: a $SiCl_4$ gas, an $NH_4$ gas, and a $H_2$ gas.
10. VN film: a $VCl_3$ gas, an $NH_4$ gas, and a $H_2$ gas.
11. ZrN film: a $ZrCl_4$ gas, a $N_2$ gas, and a $H_2$ gas.
12. Ti(CN) film: a $TiCl_4$ gas, a $CH_4$ gas, a $N_2$ gas, and a $H_2$ gas, or a $TiCl_4$ gas, an $CH_3CN$ gas, a $N_2$ gas, and a $H_2$ gas.
13. (TiAl)N film: a $TiCl_4$ gas, an $AlCl_3$ gas, a $N_2$ gas, and $NH_3$ gas.
14. (TiSi)N film: a $TiCl_4$ gas, a $SiCl_4$ gas, a $N_2$ gas, and an $NH_3$ gas.
15. (TiB)N film: a $TiCl_4$ gas, a $N_2$ gas, and a $BCl_3$ gas.
16. TiZr(CN) film: a $TiCl_4$ gas, a $ZrCl_4$ gas, a $N_2$ gas, a $CH_4$ gas, and a $H_2$ gas, or a $TiCl_4$ gas, a $ZrCl_4$ gas, a $N_2$ gas, an $CH_3CN$ gas, and a $H_2$ gas.
17. TiAl(CN) film: a $TiCl_4$ gas, an $AlCl_3$ gas, a $N_2$ gas, a $CH_4$ gas, an $NH_3$ gas, and a $H_2$ gas, or a $TiCl_4$ gas, an $AlCl_3$ gas, a $N_2$ gas, an $CH_3CN$ gas, and a $H_2$ gas.
18. TiSi(CN) film: a $TiCl_4$ gas, a $SiCl_4$ gas, a $N_2$ gas, a $CH_4$ gas, an $NH_3$ gas, and a $H_2$ gas, or a $TiCl_4$ gas, a $SiCl_4$ gas, a $N_2$ gas, an $CH_3CN$ gas, and a $H_2$ gas.
18. TiCr(CN) film: a $TiCl_4$ gas, a $CrCl_3$ gas, a $N_2$ gas, a $CH_4$ gas, an $NH_3$ gas, and a $H_2$ gas, or a $TiCl_4$ gas, a $CrCl_3$ gas, a $N_2$ gas, an $CH_3CN$ gas, and a $H_2$ gas.
19. TiV(CN) film: a $TiCl_4$ gas, a $VCl_3$ gas, a $N_2$ gas, a $CH_4$ gas, an $NH_3$ gas, and a $H_2$ gas, or a $TiCl_4$ gas, a $VCl_3$ gas, a $N_2$ gas, an $CH_3CN$ gas, and a $H_2$ gas.
20. TiZr(CN) film: a $TiCl_4$ gas, $ZrCl_3$ gas, a $N_2$ gas, a $CH_4$ gas, an $NH_3$ gas, and a $H_2$ gas, or a $TiCl_4$ gas, a $ZrCl_4$ gas, a $N_2$ gas, an $CH_3CN$ gas, and a $H_2$ gas.
21. Ti(CNO) film: a $TiCl_4$ gas, a $N_2$ gas, a $CH_4$ gas, a CO gas, and a $H_2$ gas, or a $TiCl_4$ gas, a $N_2$ gas, an $CH_3CN$ gas, a CO gas, and a $H_2$ gas.
22. TiAl(CNO) film: a $TiCl_4$ gas, an $AlCl_3$ gas, a $N_2$ gas, a $CH_4$ gas, a CO gas, and a $H_2$ gas, or a $TiCl_4$ gas, an $AlCl_3$ gas, a $N_2$ gas, an $CH_3CN$ gas, a CO gas, and a $H_2$ gas.
23. Ti(CO) film: a $TiCl_4$ gas, a $N_2$ gas, a $CH_4$ gas, a CO gas, a $CO_2$ gas, and a $H_2$ gas.
24. $TiB_2$ film: a $TiCl_4$ gas, a $BCl_3$ gas, and a $H_2$ gas.

(3) Formation of Second Upper Layer (Bonding Layer+ Oxide Layer of Al and/or Cr)

(a) Formation of Bonding Layer

To increase adhesion between the second layer and the oxide layer, a layer for bonding both layers is formed. The bonding layer is preferably a multi-layer coating comprising at least a layer having high adhesion to the second layer, and a layer having high adhesion to the oxide layer. Any layers can be formed by a known chemical vapor deposition method. The temperature of forming the bonding layer is 950-1050° C., for example, about 1000° C.

The bonding layer having high adhesion to the second layer includes a Ti(CN) film, a TiN film or a TiC film, etc. The Ti(CN) film can be formed, for example, by a starting material gas comprising a $TiCl_4$ gas, a $N_2$ gas, and a $CH_4$ gas, the balance being a $H_2$ gas. The TiN film can be formed, for example, by a starting material gas comprising a $TiCl_4$ gas, a $N_2$ gas, and a $H_2$ gas. The TiC film can be formed, for example, by a starting material gas comprising a $TiCl_4$ gas, a $CH_4$ gas, and a $H_2$ gas.

The layer having high adhesion to the oxide layer includes a Ti(NO) film, a Ti(CO) film, a Ti(CNO) film, a (TiAl)(CNO) film, a (TiB)(CNO) film, etc. The Ti(NO) film can be formed by a starting material gas comprising a $TiCl_4$ gas, a $N_2$ gas, a CO gas, a $CO_2$ gas, and a $H_2$ gas. The Ti(CO) film can be formed by a starting material gas comprising a $TiCl_4$ gas, a $CH_4$ gas, a CO gas, a $CO_2$ gas, and a $H_2$ gas. The Ti(CNO) film can be formed by a starting material gas comprising a $TiCl_4$ gas, a $CH_4$ gas, a $N_2$ gas, a CO gas, a $CO_2$ gas, and a $H_2$ gas. The (TiAl)(CNO) film can be formed by a starting material gas comprising a $TiCl_4$ gas, an $AlCl_3$ gas, a $CH_4$ gas, a $N_2$ gas, a CO gas, a $CO_2$ gas, and a $H_2$ gas. The (TiB)(CNO) film can be formed by a starting material gas comprising a $TiCl_4$ gas, a $BCl_3$ gas, a $CH_4$ gas, a $N_2$ gas, a CO gas, a $CO_2$ gas, and a $H_2$ gas.

Both of the bonding layer having high adhesion to the second layer and the bonding layer having high adhesion to the oxide layer may be as thick as 0.1-2 μm, preferably 0.3-1 μm. The bonding layer has a short life with the thickness of less than 0.1 μm, and drastically decreased adhesion with the thickness of more than 2 μm.

(b) Formation of Oxide Layer of Al and/or Cr

The aluminum oxide layer can be formed by a known chemical vapor deposition method. An $AlCl_3$ gas generated by flowing a HCl gas, and a $H_2$ gas on an Al metal piece kept at, for example, 335° C., a $CO_2$ gas, a $H_2S$ gas, a HCl gas, and a $H_2$ gas are supplied to a CVD furnace kept at 800-1050° C. (for example, about 1000° C.), to form aluminum oxide on the bonding layer by a chemical vapor deposition method. The chromium oxide layer and the aluminum chromium oxide layer can also be formed by a known chemical vapor deposition method.

(C) Formation of Cutting Edge after Hard Coating

The hard-coated surface is smoothed for better chipping resistance by working such as brushing, buffing, blasting, etc. With ceramic powder such as alumina particles, zirconia particles, silica particles, etc. as impinging media, a hard-coated cutting edge is preferably wet- or dry-blasted for smoothing, so that it is provided with excellent chipping resistance by removing or reducing residual tensile stress. The blasting pressure is properly adjusted depending on the impinging media and the hard coating thickness. For example, in a case where a hard coating as thick as 8-20 μm in total is formed on the WC-based cemented carbide substrate, alumina powder having an average diameter of 30 μm is preferably used with blasting pressure of 0.20-0.40 MPa. When the total thickness of the hard coating is 2-8 μm, the blasting pressure is preferably 0.10-0.20 MPa.

The present invention will be explained in more detail by Examples below without intention of restricting the present invention thereto. In Examples and Comparative Examples below, a flow rate (ml/minute) is ml per minute at 1 atom and 25° C. Though inserts are specifically explained as the first and second hard-coated tools in Examples and Comparative Examples, the hard-coated tools of the present invention are of course not restricted to inserts, but include solid tools.

Example 1

Figure 3A:
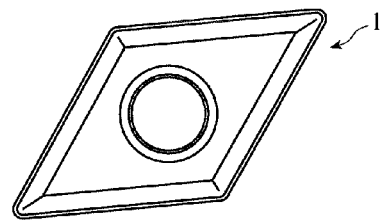
FIG. 3(a) is a plan view schematically showing a turning insert substrate.
Figure 3B:
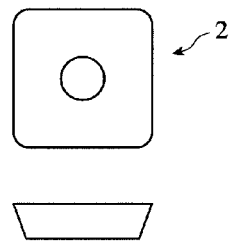
FIG. 3(b) is a schematic view showing the upper and side surface shapes of a property-evaluating insert substrate.

(1) Production of Turning Insert Coated with Single Titanium Carbonitride Layer as First Hard-Coated Tool A turning insert substrate (DNMG150408) 1 shown in FIG. 3(*a*), which was formed by WC-based cemented carbide having a composition comprising 5.2% by mass of Co, 0.4% by mass of Cr, 94.4% by mass of WC, and inevitable impurities, and a property-evaluating insert substrate (SEE42TN-G9) 2 shown in FIG. 3(*b*), which was formed by WC-based cemented carbide having a composition comprising 7.5% by mass of Co, 3.2% by mass of TaC, 1.7% by mass of TiC, 0.3% by mass of TiN, 0.3% by mass of ZrC, 87.0% by mass of WC, and inevitable impurities, were subjected to honing.

Both insert substrates (DNMG150408 and SEE42TN-G9) 1, 2 set in a CVD furnace were heated to 850° C. while flowing a $H_2$ gas. Thereafter, a starting material gas having a composition comprising 81.7% by volume of a $H_2$ gas, 15.0% by volume of a $N_2$ gas, 1.5% by volume of a $TiCl_4$ gas, 0.5% by volume of an $CH_3CN$ gas, and 1.3% by volume of an $C_2H_6$ gas was supplied at a flow rate of 6,700 ml/minute and a pressure of 8 kPa to the CVD furnace with a substrate temperature of 850° C., to form a titanium carbonitride layer having an average thickness of 3.0 μm directly on each insert substrate by a chemical vapor deposition method. An entire surface of the titanium carbonitride layer on each insert was wet-blasted with a slurry containing alumina powder having an average diameter of 30 μm as impinging media, at a blasting pressure of 0.10 MPa, to obtain hard-coated tools (turning insert and property-evaluating insert).

(2) Measurement of Thickness

The average thickness of the titanium carbonitride layer was determined by lapping each layer slantingly at an angle of 5°, etching the lapped surface with a Murakami's reagent, measuring the thickness of the etched layer at five arbitrary points by an optical microscope (magnification: 1,000 times), and averaging the measured thicknesses.

(3) Measurement of Crystal Structure

Figure 4A:
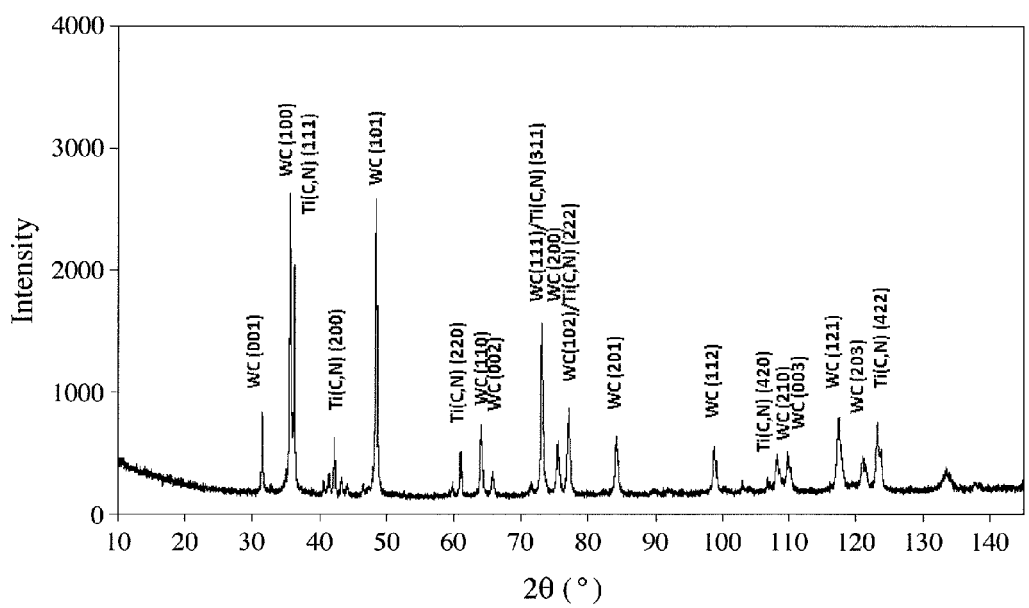
FIG. 4(a) is a graph showing an X-ray diffraction pattern of the titanium carbonitride layer (single layer) of Example 1.
Figure 4B:
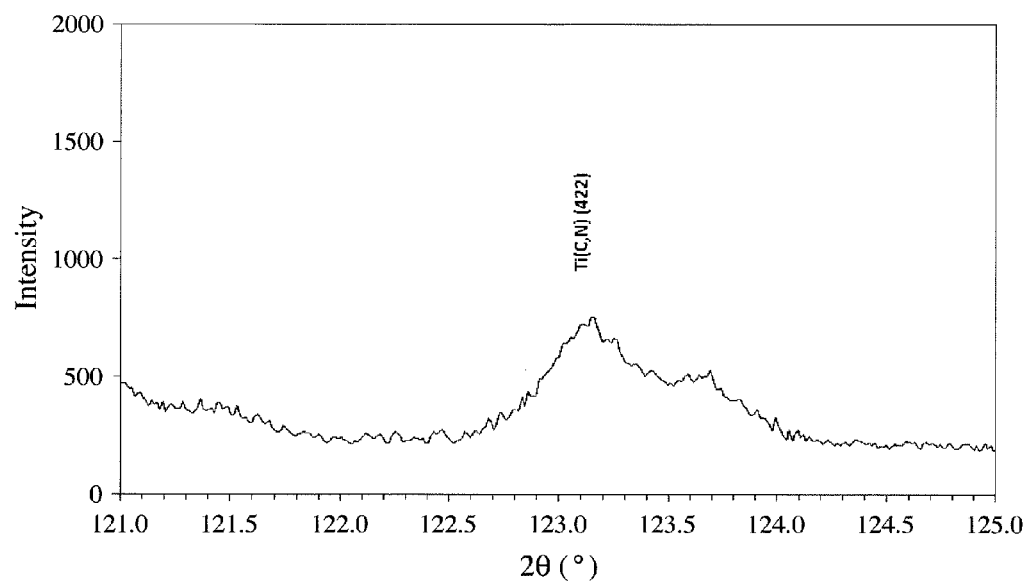
FIG. 4(b) is an enlarged graph showing part of the X-ray diffraction pattern of FIG. 4(a) in a 2θ range of 121.0-125.0°.

To identify the crystal structure of the titanium carbonitride layer, $CuK\alpha_1$ rays (wavelength λ: 0.15405 nm) were projected onto a titanium carbonitride layer on a rake face of the property-evaluating insert (SEE42TN-G9) at tube voltage of 45 kV and tube current of 40 mA, by an X-ray diffraction apparatus (EMPYREAN available from PANalytical). FIG. 4(*a*) shows an X-ray diffraction pattern in a 2θ range of 9° to 145°, and FIG. 4(*b*) enlargedly shows part of the X-ray diffraction pattern in a 2θ range of 121.0° to 125.0°. At around 123.0° in FIG. 4(*b*), a diffraction peak of a (422) plane of titanium carbonitride was observed. In FIG. 4(*a*), diffraction peaks of Ti(CN) in the titanium carbonitride layer together with those of WC in the substrate were observed.

Figure 5:
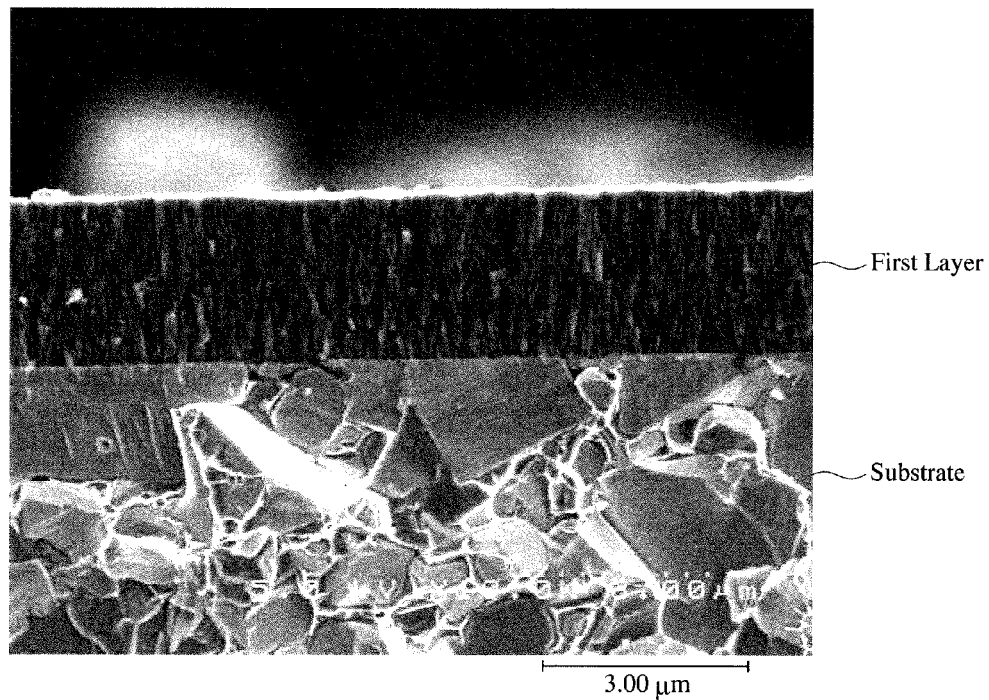
FIG. 5 is a scanning electron photomicrograph (magnification: 10,000 times) showing a fractured cross section structure of the hard-coated insert of Example 1.

(4) Observation of Crystal Structure of Titanium Carbonitride Layer, and Measurement of Average Transverse Cross Section Diameter of Columnar Crystal Grains Using a scanning electron microscope (SEM, S-4200 available from Hitachi, Ltd., magnification: 10,000 times), a fractured cross section of a titanium carbonitride layer in a honed cutting edge portion of the property-evaluating milling insert (SEE42TN-G9) was observed. As a result, it was confirmed that the titanium carbonitride layer had a columnar crystal structure as shown in FIG. 5. As is clear from FIG. 5, the titanium carbonitride layer of Example 1 was composed of extremely fine crystal grains. The average transverse cross section diameter d of titanium carbonitride crystal grains determined on FIG. 5 was 0.09 μm.

(5) Measurement of Composition

The amounts of Ti, C and N in the titanium carbonitride layer were measured by an electron probe microanalyzer (EPMA, JXA-8500F available from JEOL Ltd.) under the conditions of acceleration voltage of 10 kV, irradiation current of 0.05 uA, and a beam diameter of 0.5 μm. The compositions of a thin lower layer and a layer directly on the substrate were analyzed by an energy-dispersive X-ray spectrometer (EDS, UTW-type Si (Li) semiconductor detector available from NORAN, beam diameter: about 1 nm) attached to a field-emission transmission electron microscope (TEM, JEM-2010F available from JEOL Ltd.), and a scanning auger electron microscope (SMART200 available from PHI, acceleration voltage: 10 kV, sample current: 10 nA, and electron probe diameter: 0.1 µm or less). Composition analyses with each of EPMA, EDS and auger electron spectroscopy (AES) were conducted at five arbitrary center points in a thickness direction, and averaged.

The compositions of crystal grain boundaries and crystal grains in the titanium carbonitride layer were analyzed by EDS (beam diameter: 0.2 nm) attached to TEM. The mass ratios of metal components were $x_1=0.47$, $y_1=0.43$, and $z_1=0.10$ in crystal grain boundaries, and $x_2=0.86$, $y_2=0.11$, and $z_2=0.03$ in crystal grains. The results are shown in Table 1.

(6) Measurement of Average Thickness of W-Diffused Layer

To measure the average thickness of a W-diffused layer in the titanium carbonitride layer, a sample for observing a cross section structure was cut out of the hard-coated tool, ground, and then subjected to dimpling and milling with Ar ion. A dark-field STEM image of this sample was observed at acceleration voltage of 120 kV. The results are shown in FIG. 6(*a*).

Figure 6A:
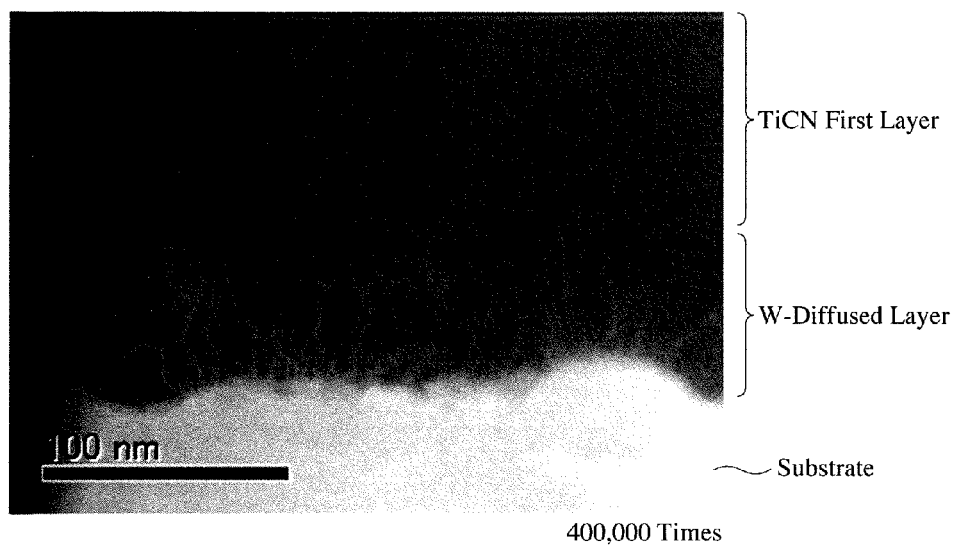
FIG. 6(a) is a dark-field, scanning transmission electron photomicrograph (STEM photograph, magnification: 400,000 times) showing the cross-section structures of a substrate and a titanium carbonitride layer in the hard-coated insert of Example 1.
Figure 6B:
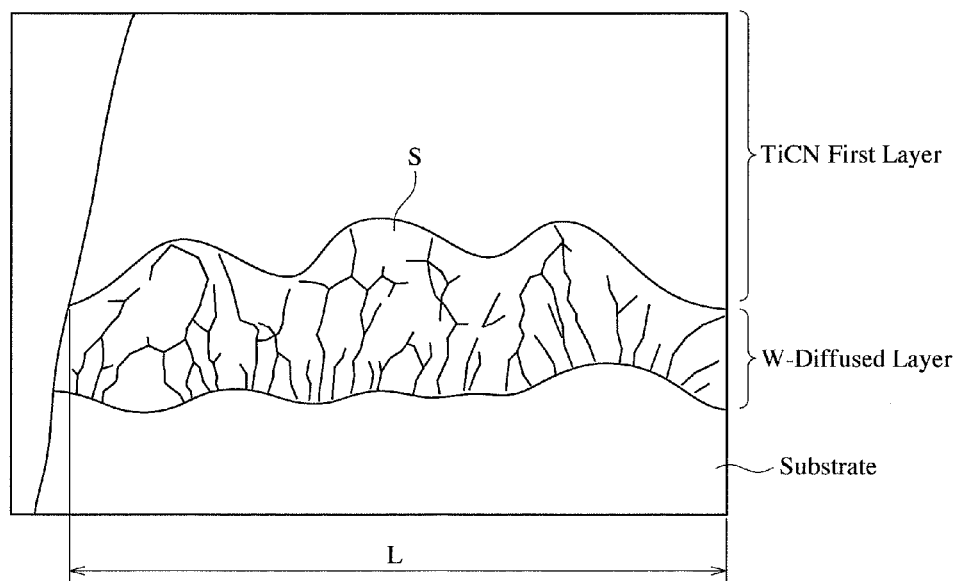
FIG. 6(b) is a schematic view of the dark-field STEM photograph of FIG. 6(a) for showing a method for determining the average thickness of a W-diffused layer.
Figure 7:
FIG. 7 is a dark-field STEM photograph showing part of the W-diffused layer.

As shown in FIG. 6(*a*), W, a substrate component, diffused mainly along boundaries of titanium carbonitride crystal grains is distributed in white lines in the dark-field STEM image. To clarify the diffusion of W, average intensity and standard deviation σ in arbitrary crystal grains were measured in a STEM image, to carry out an image treatment of each pixel strength—average strength—3σ. The results are shown in FIG. 7. In a W-diffused grain boundary thus determined, as schematically shown in FIG. 6(*b*), a region between an envelope connecting tip ends of the W-diffused region (tip ends of a white line on the image-treated darkfield STEM image) and the substrate was defined as a W-diffused layer. The average thickness of the W-diffused layer in each field can be determined by dividing the area S of the W-diffused layer by the length L of the W-diffused layer. S/L was determined in three arbitrary fields, and averaged to calculate the average thickness of the W-diffused layer. As a result, the average thickness of the W-diffused layer was 68 nm.

(7) Measurement of Hardness

By a nano-indentation method using a nano-indentation hardness tester (ENT-1100 available from Elionix Inc.) with a Si single crystal as a standard sample, the hardness of the titanium carbonitride layer was measured 5 times at thickness-direction center positions, and averaged. The measurement conditions were a maximum load of 4900 mN, a load speed of 49 mN/second, and a keeping time of 1 second. The results are shown in Table 1.

(8) Evaluation of Performance

Using turning inserts each coated with a titanium carbonitride layer, a work of Inconel 718 (having a composition comprising 52.5% by mass of Ni, 19.0% by mass of Cr, 18.5% by mass of Fe, 5.0% by mass of (Nb+Ta), 3.0% by mass of Mo, 0.8% by mass of Ti, 0.5% by mass of Al, and 0.04% by mass of C), as a difficult-to-cut material, was machined under the turning conditions below, to evaluate the peeling of the titanium carbonitride layer and a tool life. The flank wear width and chipping of the titanium carbonitride layer were evaluated by observation with an optical microscope (magnification: 100 times). A machining time when the maximum wear width of a flank exceeded 0.350 mm, or when chipping occurred in the flank, was defined as the tool life. The results are shown in Table 2.

Work: Inconel 718,
Machining method: Continuous turning,
Insert shape: DNMG150408,
Cutting speed: 40 m/minute,
Feed speed: 0.20 mm/rev.,
Cutting depth: 0.8 mm, and
Cutting liquid: Aqueous cutting liquid.

Examples 2-21

Figure 8:
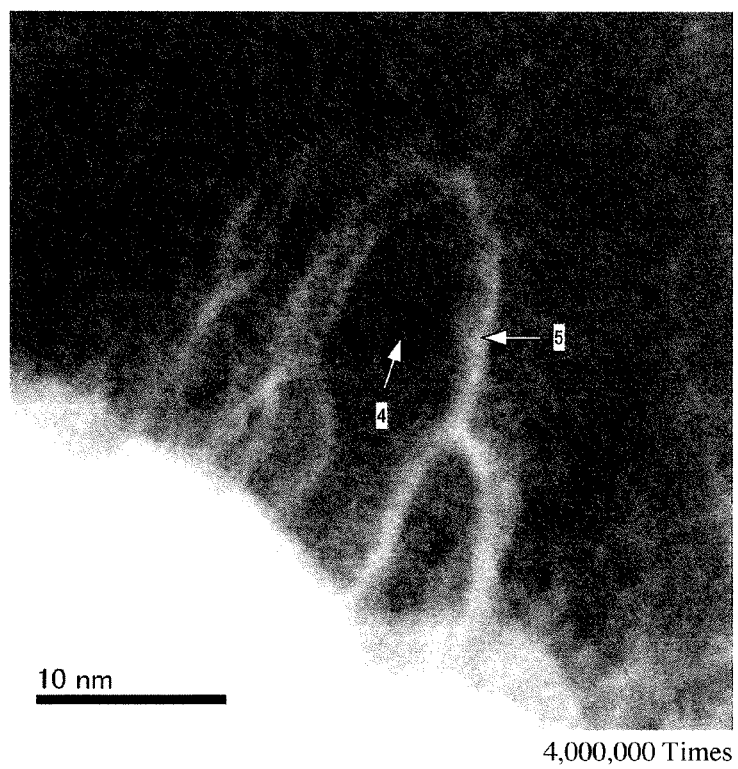
FIG. 8 is a dark-field STEM photograph (magnification: 4,000,000 times) showing a W-diffused layer in the hard-coated insert of Example 4.

Hard-coated inserts were produced and evaluated with respect to properties and performance in the same manner as in Example 1, except for changing the conditions of forming the first layer as shown in Table 1. A W-diffused layer in the hard-coated insert of Example 4 is shown in FIG. 8, in which 4 represents crystal grains, and 5 represents W diffused to crystal grain boundaries.

Comparative Examples 1-8

Hard-coated inserts were produced and evaluated with respect to properties and performance in the same manner as in Example 1, except for changing the conditions of forming a TiCN layer directly on the WC-based cemented carbide substrate as shown in Table 3 in Comparative Examples 1-3, and except for changing the conditions of forming a TiN layer, a TiC layer, and a TiCN layer directly on the WC-based cemented carbide substrate as shown in Tables 5 and 6 in Comparative Examples 4-8.

In Comparative Example 1, a single layer of titanium carbonitride was formed directly on the same substrate as in Example 1, using a starting material gas containing an $C_2H_6$ gas without an $CH_3CN$ gas. In Comparative Example 2, a single layer of titanium carbonitride was formed directly on the same substrate as in Example 1, using a starting material gas containing an $CH_3CN$ gas without an $C_2H_6$ gas. In Comparative Example 3, a single layer of titanium carbonitride was formed directly on the same substrate as in Example 1, like the inventive products 1 and 2 in Table 1 of JP 2008-87150 A. In Comparative Example 4, a titanium nitride layer and a titanium carbonitride layer were formed directly on the same substrate as in Example 1, as in the inventive coated cutting tool 1 in Table 3 of JP 9-262705 A. In Comparative Example 5, a titanium nitride layer and a titanium carbonitride layer were formed directly on the same substrate as in Example 1, as in the inventive products 1 and 2 in Table 1 of JP 2008-87150 A. In Comparative Example 6, a titanium carbide layer and a titanium carbonitride layer were formed directly on the same substrate as in Example 1, as in Japanese Patent 3503658. In Comparative Example 7, a TiCN layer and thin TiCN film i were formed directly on the same substrate as in Example 1, as in the inventive coated cermet tool 3 in Table 6 of Japanese Patent 4720283. In Comparative Example 8, a conventional TiCN layer in Table 5 of Japanese Patent 4534790 was formed directly on the same substrate as in Example 1, and a modified TiCN layer (g) in Table 4 of Japanese Patent 4534790 was formed directly thereon.

Figure 9:
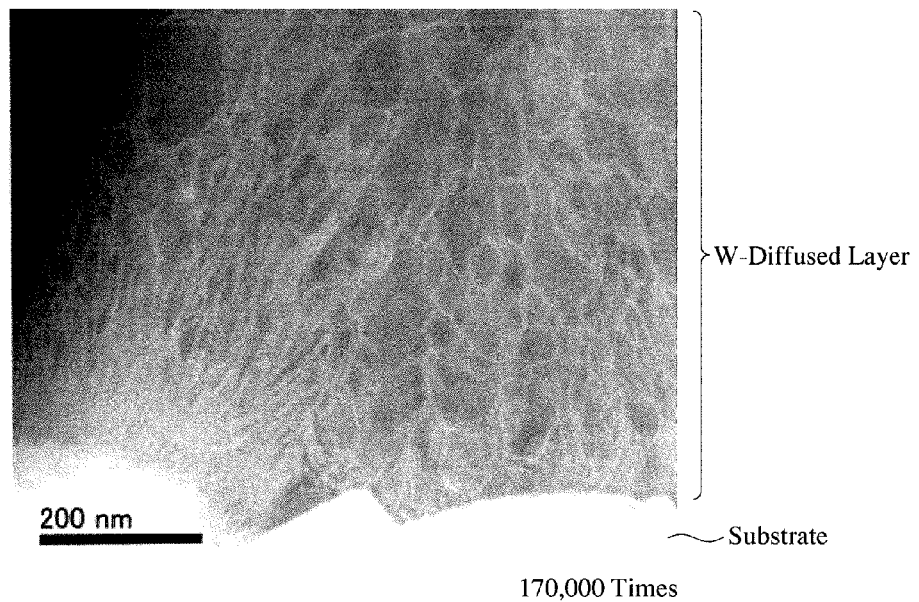
FIG. 9 is a dark-field STEM photograph (magnification: 170,000 times) showing a fractured cross-section structure of a substrate and a titanium carbonitride layer in the hard-coated insert of Comparative Example 5.

A W-diffused layer in the titanium nitride layer of Comparative Example 5 is shown in FIG. 9. The average thickness of a W-diffused layer in the titanium nitride layer was 1255 nm.

With respect to Examples 1-21, the forming conditions and properties [composition, structure, thickness, average transverse cross section diameter d, hardness, and the 2θ peak position of a (422) plane] of the first layer (titanium carbonitride layer) are shown in Table 1, and their cutting evaluation results are shown in Table 2.

With respect to Comparative Examples 1-3, the forming conditions and properties [composition, structure, thickness, average transverse cross section diameter d, hardness, and the 2θ peak position of a (422) plane] of the TiCN layer formed directly on the substrate are shown in Table 3, and their cutting evaluation results are shown in Table 4. With respect to Comparative Examples 4-8, the forming conditions of the first layer and the forming conditions and properties [composition, structure, thickness, average transverse cross section diameter d, hardness, and the 2θ peak position of a (422) plane] of the second layer are shown in Tables 5 and 6, and their cutting evaluation results are shown in Table 7. The composition of each layer in Examples 1-21 and Comparative Examples 1-8 was measured at a thickness-direction center.

TABLE 1

| | Conditions of Forming First Layer [TiCN Layer] | | | | | |
|---|---|---|---|---|---|---|
| | Substrate Temperature | Starting Material Gas | Starting Material Gas Composition (% by volume) | | | |
| No. | (° C.) | Pressure (kPa) | $H_2$ | $N_2$ | $TiCl_4$ | $CH_3CN$ | $C_2H_6$ |
| Example 1 | 850 | 8 | 81.7 | 15 | 1.5 | 0.5 | 1.3 |
| Example 2 | 800 | 8 | 81.7 | 15 | 1.5 | 0.5 | 1.3 |
| Example 3 | 820 | 8 | 81.7 | 15 | 1.5 | 0.5 | 1.3 |
| Example 4 | 860 | 8 | 81.7 | 15 | 1.5 | 0.5 | 1.3 |
| Example 5 | 880 | 8 | 81.7 | 15 | 1.5 | 0.5 | 1.3 |
| Example 6 | 850 | 5 | 81.7 | 15 | 1.5 | 0.5 | 1.3 |
| Example 7 | 850 | 10 | 81.7 | 15 | 1.5 | 0.5 | 1.3 |
| Example 8 | 850 | 8 | 91.7 | 5 | 1.5 | 0.5 | 1.3 |
| Example 9 | 850 | 8 | 86.7 | 10 | 1.5 | 0.5 | 1.3 |
| Example 10 | 850 | 8 | 76.7 | 20 | 1.5 | 0.5 | 1.3 |
| Example 11 | 850 | 8 | 66.7 | 30 | 1.5 | 0.5 | 1.3 |
| Example 12 | 850 | 8 | 82.2 | 15 | 1 | 0.5 | 1.3 |
| Example 13 | 850 | 8 | 81.2 | 15 | 2 | 0.5 | 1.3 |
| Example 14 | 850 | 8 | 80.2 | 15 | 3 | 0.5 | 1.3 |
| Example 15 | 850 | 8 | 82.1 | 15 | 1.5 | 0.1 | 1.3 |
| Example 16 | 850 | 8 | 81.2 | 15 | 1.5 | 1 | 1.3 |
| Example 17 | 850 | 8 | 80.7 | 15 | 1.5 | 1.5 | 1.3 |
| Example 18 | 880 | 8 | 80.9 | 15 | 1.5 | 0.1 | 2.5 |
| Example 19 | 850 | 8 | 82.5 | 15 | 1.5 | 0.5 | 0.5 |
| Example 20 | 850 | 8 | 81.0 | 15 | 1.5 | 0.5 | 2.0 |
| Example 21 | 850 | 8 | 80.5 | 15 | 1.5 | 0.5 | 2.5 |

| | Properties of First Layer [TiCN Layer] | | | | | | | | |
|---|---|---|---|---|---|---|---|---|---|
| | Composition (% by mass) | | | | | $T^{(1)}$ | $d^{(2)}$ | $H^{(3)}$ | Peak$^{(4)}$ of |
| No. | Ti | C | N | C/(C + N) | Structure | (μm) | (μm) | (GPa) | (422) Plane |
| Example 1 | 78.4 | 14.8 | 6.8 | 0.69 | Columnar | 3.0 | 0.09 | 35 | 123.4 |
| Example 2 | 78.5 | 14.5 | 7.0 | 0.67 | Columnar | 3.0 | 0.10 | 34 | 123.5 |
| Example 3 | 78.5 | 14.6 | 6.9 | 0.68 | Columnar | 3.0 | 0.10 | 34 | 123.5 |
| Example 4 | 78.3 | 14.9 | 6.8 | 0.69 | Columnar | 3.0 | 0.13 | 35 | 123.4 |
| Example 5 | 78.6 | 15.0 | 6.4 | 0.70 | Columnar | 3.0 | 0.16 | 32 | 123.3 |
| Example 6 | 78.9 | 14.2 | 6.9 | 0.67 | Columnar | 3.0 | 0.07 | 34 | 123.2 |
| Example 7 | 78.7 | 14.3 | 7.0 | 0.67 | Columnar | 3.0 | 0.22 | 30 | 123.3 |
| Example 8 | 78.2 | 15.2 | 6.6 | 0.70 | Columnar | 3.0 | 0.20 | 31 | 123.3 |
| Example 9 | 78.4 | 14.8 | 6.8 | 0.69 | Columnar | 3.0 | 0.09 | 34 | 123.4 |
| Example 10 | 78.5 | 14.2 | 7.3 | 0.66 | Columnar | 3.0 | 0.12 | 33 | 123.2 |
| Example 11 | 78.5 | 14.0 | 7.5 | 0.65 | Columnar | 3.0 | 0.15 | 34 | 123.5 |
| Example 12 | 78.3 | 14.3 | 7.4 | 0.66 | Columnar | 3.0 | 0.07 | 35 | 123.3 |
| Example 13 | 78.7 | 14.5 | 6.8 | 0.68 | Columnar | 3.0 | 0.10 | 34 | 123.4 |
| Example 14 | 78.6 | 14.8 | 6.6 | 0.69 | Columnar | 3.0 | 0.15 | 33 | 123.2 |
| Example 15 | 77.2 | 15.8 | 7.0 | 0.69 | Columnar | 3.0 | 0.08 | 34 | 123.6 |
| Example 16 | 78.2 | 14.8 | 7.0 | 0.68 | Columnar | 3.0 | 0.12 | 33 | 123.1 |
| Example 17 | 78.2 | 14.6 | 7.2 | 0.67 | Columnar | 3.0 | 0.20 | 31 | 123.6 |
| Example 18 | 77.2 | 13.8 | 9.0 | 0.61 | Columnar | 3.0 | 0.22 | 30 | 123.7 |
| Example 19 | 77.0 | 14.0 | 9.0 | 0.61 | Columnar | 3.0 | 0.21 | 30 | 123.6 |
| Example 20 | 78.0 | 15.5 | 6.5 | 0.70 | Columnar | 3.0 | 0.07 | 36 | 122.8 |
| Example 21 | 78.0 | 16.0 | 6.0 | 0.73 | Columnar | 3.0 | 0.06 | 37 | 122.7 |

TABLE 1-continued

| | | Crystal Composition (Mass Ratio) of First Layer [TiCN Layer] | | | | | |
|---|---|---|---|---|---|---|---|
| | Average Thickness of W-Diffused | Metal Composition of Crystal Grain Boundaries $[Ti x_1 W y_1 Co z_1]$ | | | Metal Composition of Crystal Grains $[Ti x_2 W y_2 Co z_2]$ | | |
| No. | Layer (nm) | $x_1$ | $y_1$ | $z_1$ | $x_2$ | $y_2$ | $z_2$ |
| Example 1 | 68 | 0.47 | 0.43 | 0.10 | 0.86 | 0.11 | 0.03 |
| Example 2 | 32 | 0.67 | 0.25 | 0.08 | 0.93 | 0.06 | 0.01 |
| Example 3 | 45 | 0.60 | 0.31 | 0.09 | 0.91 | 0.08 | 0.01 |
| Example 4 | 85 | 0.39 | 0.48 | 0.13 | 0.85 | 0.10 | 0.05 |
| Example 5 | 150 | 0.28 | 0.58 | 0.15 | 0.66 | 0.23 | 0.11 |
| Example 6 | 33 | 0.56 | 0.35 | 0.09 | 0.88 | 0.10 | 0.02 |
| Example 7 | 182 | 0.25 | 0.59 | 0.16 | 0.73 | 0.21 | 0.06 |
| Example 8 | 152 | 0.31 | 0.54 | 0.15 | 0.76 | 0.19 | 0.05 |
| Example 9 | 118 | 0.43 | 0.46 | 0.11 | 0.89 | 0.08 | 0.03 |
| Example 10 | 52 | 0.49 | 0.41 | 0.10 | 0.88 | 0.09 | 0.03 |
| Example 11 | 36 | 0.71 | 0.23 | 0.06 | 0.98 | 0.02 | 0.01 |
| Example 12 | 148 | 0.35 | 0.50 | 0.15 | 0.77 | 0.17 | 0.06 |
| Example 13 | 54 | 0.45 | 0.43 | 0.12 | 0.88 | 0.09 | 0.03 |
| Example 14 | 38 | 0.56 | 0.35 | 0.09 | 0.94 | 0.05 | 0.01 |
| Example 15 | 192 | 0.29 | 0.57 | 0.14 | 0.63 | 0.25 | 0.12 |
| Example 16 | 54 | 0.55 | 0.36 | 0.09 | 0.84 | 0.13 | 0.03 |
| Example 17 | 172 | 0.37 | 0.51 | 0.12 | 0.68 | 0.22 | 0.10 |
| Example 18 | 30 | 0.75 | 0.20 | 0.05 | 1.00 | 0.00 | 0.00 |
| Example 19 | 35 | 0.65 | 0.28 | 0.07 | 0.92 | 0.05 | 0.01 |
| Example 20 | 181 | 0.31 | 0.54 | 0.15 | 0.63 | 0.24 | 0.13 |
| Example 21 | 200 | 0.20 | 0.60 | 0.20 | 0.55 | 0.30 | 0.15 |

Note:
[1]Thickness.
[2]Average transverse cross section diameter.
[3]Hardness.
[4]The position (2θ) of a peak of a (422) plane.

TABLE 2

| | Evaluation of Cutting | |
|---|---|---|
| No. | Chipping[1] | Life[2] (minute) |
| Example 1 | No | 40 |
| Example 2 | No | 25 |
| Example 3 | No | 30 |
| Example 4 | No | 30 |
| Example 5 | No | 25 |
| Example 6 | No | 25 |
| Example 7 | No | 15 |
| Example 8 | No | 20 |
| Example 9 | No | 40 |
| Example 10 | No | 40 |
| Example 11 | No | 25 |
| Example 12 | No | 25 |
| Example 13 | No | 40 |
| Example 14 | No | 25 |
| Example 15 | No | 20 |
| Example 16 | No | 40 |
| Example 17 | No | 10 |
| Example 18 | No | 10 |
| Example 19 | No | 10 |
| Example 20 | No | 20 |
| Example 21 | No | 15 |

Note:
[1]The presence of chipping when reaching the tool life.
[2]Tool life.

TABLE 3

| | Conditions of Forming TiCN Layer Directly on Substrate | | | | | | |
|---|---|---|---|---|---|---|---|
| | Substrate Temperature (° C.) | Starting Material Gas Pressure (kPa) | Starting Material Gas Composition (% by volume) | | | | |
| No. | | | $H_2$ | $N_2$ | $TiCl_4$ | $CH_3CN$ | Hydrocarbon Gas/ Concentration |
| Com. Ex. 1 | 850 | 8 | 66.0 | 32.2 | 0.5 | 0.0 | $C_2H_6$/1.3 |
| Com. Ex. 2 | 850 | 8 | 83.0 | 15.0 | 1.5 | 0.5 | — |
| Com. Ex. 3 | 880 | 8 | 95.0 | 0.0 | 1.5 | 0.3 | $C_2H_6$/3.2 |

TABLE 3-continued

| | Properties of TiCN Layer Directly on Substrate | | | | | | | | |
|---|---|---|---|---|---|---|---|---|---|
| | Composition (% by mass) | | | | | $T^{(1)}$ | $d^{(2)}$ | $H^{(3)}$ | Peak$^{(4)}$ of |
| No. | Ti | C | N | C/(C + N) | Structure | (μm) | (μm) | (GPa) | (422) Plane |
| Com. Ex. 1 | 78.5 | 17.2 | 4.3 | 0.80 | Columnar | 3.0 | 0.08 | 39 | 122.5 |
| Com. Ex. 2 | 77.9 | 12.7 | 9.4 | 0.57 | Columnar | 3.0 | 0.51 | 26 | 123.7 |
| Com. Ex. 3 | 77.9 | 14.5 | 7.6 | 0.66 | Columnar | 3.0 | 0.48 | 29 | 122.3 |

| | | Crystal Composition (Mass Ratio) of TiCN Layer Directly on Substrate | | | | | |
|---|---|---|---|---|---|---|---|
| | Average Thickness of W-Diffused | Metal Composition of Crystal Grain Boundaries [Ti$x_1$W$y_1$Co$z_1$] | | | Metal Composition of Crystal Grains [Ti$x_2$W$y_2$Co$z_2$] | | |
| No. | Layer (nm) | $x_1$ | $y_1$ | $z_1$ | $x_2$ | $y_2$ | $z_2$ |
| Com. Ex. 1 | 1862 | 0.17 | 0.61 | 0.22 | 0.52 | 0.32 | 0.16 |
| Com. Ex. 2 | 5 | 0.93 | 0.05 | 0.02 | 1.00 | 0.00 | 0.00 |
| Com. Ex. 3 | 1120 | 0.13 | 0.62 | 0.25 | 0.53 | 0.31 | 0.16 |

Note:
$^{(1)}$Thickness.
$^{(2)}$Average transverse cross section diameter.
$^{(3)}$Hardness.
$^{(4)}$The position (2θ) of a peak of a (422) plane.

TABLE 4

| | Evaluation of Cutting | |
|---|---|---|
| No. | Chipping$^{(1)}$ | Life$^{(2)}$ (minute) |
| Com. Ex. 1 | Yes | 3 |
| Com. Ex. 2 | No | 5 (Peeled) |
| Com. Ex. 3 | Yes | 5 |

Note:
$^{(1)}$The presence of chipping when reaching the tool life.
$^{(2)}$Tool life.

TABLE 5

| | Conditions of Forming Layers [TiN Layer, TiC Layer, and TiCN Layer] Directly on Substrate | | | | | | | |
|---|---|---|---|---|---|---|---|---|
| | | Substrate Temp. | $P^{(1)}$ | Starting Material Gas Composition (% by volume) | | | | |
| No. | Type | (° C.) | (kPa) | $H_2$ | $N_2$ | $TiCl_4$ | $CH_3CN$ | $CH_4$ |
| Com. Ex. 4 | TiN | 920 | 6.7 | 73.0 | 25.0 | 2.0 | — | — |
| Com. Ex. 5 | TiN | 880 | 40 | 48.8 | 48.8 | 2.4 | — | — |
| Com. Ex. 6 | TiC | 1030 | 13.3 | 93.0 | — | 2.0 | 5.0 | — |
| Com. Ex. 7 | TiCN | 850 | 12 | 74.8 | 20.0 | 4.2 | — | 1.0 |
| Com. Ex. 8 | TiCN | 850 | 15 | 74.8 | 20.0 | 4.2 | — | 1.0 |

Note:
$^{(1)}$The pressure of a starting material gas.

| | Properties of Layer [TiN Layer, TiC Layer, TiCN Layer] Directly on Substrate | | | | | | | |
|---|---|---|---|---|---|---|---|---|
| | Composition (% by mass) | | | | | $T^{(1)}$ | $d^{(2)}$ | $H^{(3)}$ |
| No. | Ti | C | N | C/(C + N) | Structure | (μm) | (μm) | (GPa) |
| Com. Ex. 4 | 78.0 | — | 22.0 | — | Granular | 1.1 | 0.25 | 23 |
| Com. Ex. 5 | 77.0 | — | 23.0 | — | Granular | 1.0 | 0.26 | 23 |
| Com. Ex. 6 | 79.0 | 21.0 | — | — | Granular | 1.0 | 0.27 | 36 |

TABLE 5-continued

| | | | | | | | | |
|---|---|---|---|---|---|---|---|---|
| Com. Ex. 7 | 78.6 | 12.6 | 8.8 | 0.59 | Columnar | 1.0 | 0.33 | 26 |
| Com. Ex. 8 | 78.5 | 12.5 | 9.0 | 0.58 | Granular | 1.0 | 0.34 | 26 |

Note:
[1]Thickness.
[2]Average transverse cross section diameter.
[3]Hardness.

| | Average Thickness of W-diffused Layer | Crystal Composition (Mass Ratio) of Layer [TiN Layer, TiC Layer, TiCN Layer] Directly on Substrate | | | | | |
|---|---|---|---|---|---|---|---|
| | | Metal Composition of Crystal Grain Boundaries $[Ti x_1 W y_1 Co z_1]$ | | | Metal Composition of Crystal Grains $[Ti x_2 W y_2 Co z_2]$ | | |
| No. | (nm) | $x_1$ | $y_1$ | $z_1$ | $x_2$ | $y_2$ | $z_2$ |
| Com. Ex. 4 | 1452 | 0.38 | 0.38 | 0.24 | 0.77 | 0.15 | 0.08 |
| Com. Ex. 5 | 1255 | 0.27 | 0.48 | 0.25 | 0.72 | 0.19 | 0.09 |
| Com. Ex. 6 | 2181 | 0.12 | 0.53 | 0.35 | 0.66 | 0.22 | 0.12 |
| Com. Ex. 7 | 10 | 0.86 | 0.11 | 0.03 | 1.00 | 0.00 | 0.00 |
| Com. Ex. 8 | 9 | 0.86 | 0.12 | 0.02 | 1.00 | 0.00 | 0.00 |

TABLE 6

Conditions of Forming Second Layer [TiCN Layer]

| | Substrate Temperature | Starting Material Gas Pressure | Starting Material Gas Composition (% by volume) | | | | |
|---|---|---|---|---|---|---|---|
| No. | (° C.) | (kPa) | $H_2$ | $N_2$ | $TiCl_4$ | $CH_3CN$ | HC/Conc.[1] |
| Com. Ex. 4 | 910 | 6.7 | 77.4 | 20.0 | 2.0 | 0.6 | — |
| Com. Ex. 5 | 880 | 8.0 | 95.0 | 0.0 | 1.5 | 0.3 | $C_2H_6$/3.2 |
| Com. Ex. 6 | 1030 | 13.3 | 73.0 | 20.0 | 2.0 | — | $CH_4$/5.0 |
| Com. Ex. 7 | 770 | 12 | 64.6 | 30.0 | 0.36 | — | $C_3H_6$/5.0 |
| Com. Ex. 8 | 730 | 40 | 76.2 | 20.0 | 0.80 | 0.8 | $C_2H_4$/2.2 |

Note:
[1]Hydrocarbon gas and its concentration.

| | Properties of Second Layer [TiCN Layer] | | | | | | | |
|---|---|---|---|---|---|---|---|---|
| | Composition (% by mass) | | | | | $T^{(1)}$ | $d^{(2)}$ | $H^{(3)}$ | Peak[4] of |
| No. | Ti | C | N | C/(C + N) | Structure | (μm) | (μm) | (GPa) | (422) Plane |
| Com. Ex. 4 | 79.9 | 12.2 | 7.9 | 0.61 | Columnar | 1.9 | 0.53 | 28 | 123.5 |
| Com. Ex. 5 | 78.4 | 14.8 | 6.8 | 0.69 | Columnar | 2.0 | 0.48 | 29 | 122.4 |
| Com. Ex. 6 | 78.6 | 11.2 | 10.2 | 0.52 | Columnar | 2.0 | 0.85 | 26 | 123.8 |
| Com. Ex. 7 | 77.6 | 17.2 | 5.2 | 0.77 | Columnar | 2.5 | 0.34 | 29 | 122.1 |
| Com. Ex. 8 | 77.4 | 16.8 | 5.8 | 0.74 | Columnar | 2.0 | 0.35 | 29 | 122.3 |

Note:
(1)Thickness.
(2)Average transverse cross section diameter.
(3)Hardness.
(4)The position (2θ) of a peak of a (422) plane.

TABLE 7

| | Evaluation of Cutting | |
|---|---|---|
| No. | Chipping[1] | Life[2] (minute) |
| Com. Ex. 4 | Yes | 5 |
| Com. Ex. 5 | Yes | 5 |
| Com. Ex. 6 | Yes | 3 |
| Com. Ex. 7 | No | 5 (Peeled) |
| Com. Ex. 8 | No | 3 (Peeled) |

Note:
[1]The presence of chipping when reaching the tool life.
[2]Tool life.

Even when a difficult-to-cut material (Inconel 718) was cut by turning, any hard-coated inserts of Examples 1-21 exhibited tool lives of 10 minutes or more, 2 times or more longer than those of Comparative Examples 1-8. This indicates that the hard-coated inserts of Examples 1-21 are high-performance inserts never obtained conventionally. Such high performance is obtained for reasons below. Namely, because of a W-diffused layer having an average thickness in a range of 30-200 nm, each hard-coated insert of Examples 1-21 comprises a hard coating having high adhesion to the substrate with little embrittlement in the substrate, thereby having excellent chipping resistance, and further excellent wear resistance due to the high-hardness first layer.

Figure 10A:
FIG. 10(a) is a photomicrograph showing a cutting edge of the insert of Example 1, when it reached its life.
Figure 10B:
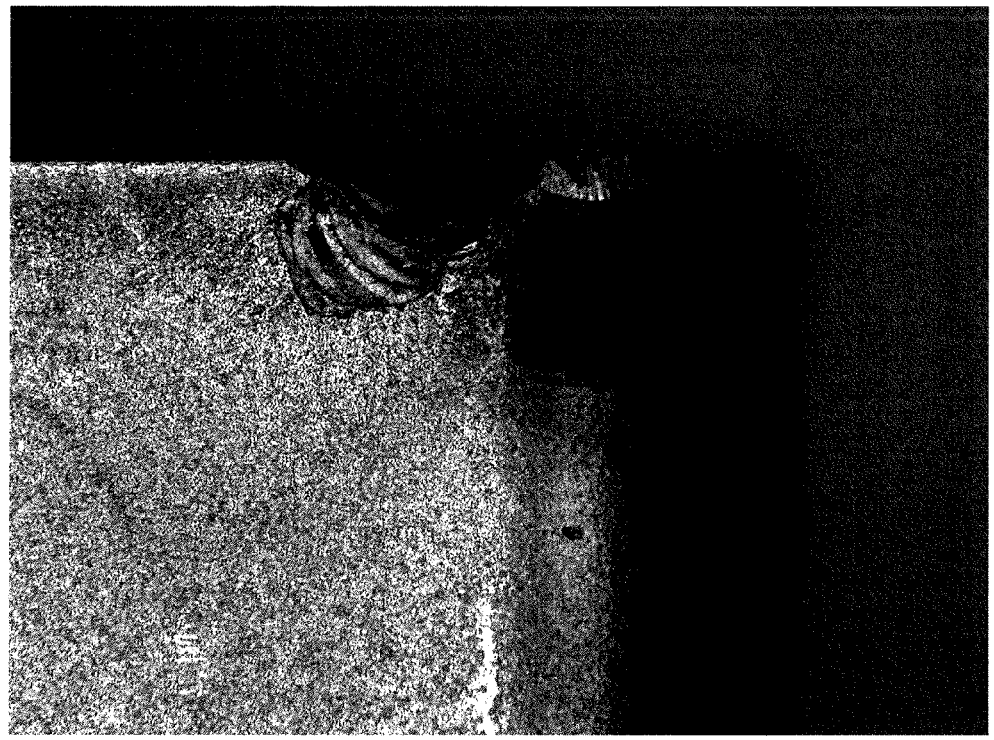
FIG. 10(b) is a photomicrograph showing a cutting edge of the insert of Comparative Example 5, when it reached its life.

On the other hand, because the W-diffused layer had an average thickness of 1,000 nm or more in Comparative Examples 1 and 3 comprising a single layer of titanium carbonitride, a work was seized to a cutting edge during turning, so that chipping occurred with the coating and part of the tool substrate peeled by the repeated detachment of the seized work material, resulting in short tool lives. In the hard-coated insert of Comparative Example 2 comprising a single layer of titanium carbonitride, the diffusion of W, a substrate component, was not observed, resulting in poor adhesion of the titanium carbonitride layer to the substrate, which causes tool-life-shortening peeling. In any of the hard-coated inserts of Comparative Examples 4-6, too, the W-diffused layer had an average thickness of 1,000 nm or more, so that a work was seized to its cutting edge. As a result, the hard coating and part of the tool substrate are peeled by the repeated detachment, resulting in chipping and thus a short tool life. In any of the hard-coated inserts of Comparative Examples 7 and 8, the W-diffused layer had an average thickness of less than 30 nm, resulting in the peeling of a hard coating with poor adhesion, and thus a short tool life. FIG. 10(a) shows a cutting edge of the insert of Example 1 when reaching its life, and FIG. 10(b) shows a cutting edge of the insert of Comparative Example 4 when reaching its life. Though the insert of Comparative Example 4 had a short life because of large chipping in its cutting edge, the insert of Example 1 had a long life without large chipping in its cutting edge, exhibiting excellent chipping resistance.

Examples 22-26

Average Thickness of First Layer

Each hard-coated insert was produced in the same manner as in Example 1, except for forming a first layer of 1.0-8.0 μm in thickness directly on the same substrate as in Example 1, with the film-forming time properly changed. With respect to these inserts, the properties measured in the same manner as in Example 1 are shown in Table 8, and their cutting evaluation results are shown in Table 9.

TABLE 8

| | Properties of First Layer [TiCN Layer] | | | | | | | | |
|---|---|---|---|---|---|---|---|---|---|
| | Composition (% by mass) | | | | | $T^{(1)}$ | $d^{(2)}$ | $H^{(3)}$ | Peak[4] of |
| No. | Ti | C | N | C/(C + N) | Structure | (μm) | (μm) | (GPa) | (422) Plane |
| Example 1 | 78.4 | 14.8 | 6.8 | 0.69 | Columnar | 3.0 | 0.09 | 35 | 123.4 |
| Example 22 | 78.4 | 14.9 | 6.7 | 0.69 | Columnar | 1.0 | 0.07 | 35 | 123.4 |
| Example 23 | 78.2 | 14.9 | 6.9 | 0.68 | Columnar | 2.0 | 0.08 | 36 | 123.4 |
| Example 24 | 78.3 | 14.6 | 7.1 | 0.67 | Columnar | 4.0 | 0.11 | 35 | 123.5 |
| Example 25 | 78.3 | 14.5 | 7.2 | 0.67 | Columnar | 6.0 | 0.12 | 34 | 123.5 |
| Example 26 | 78.2 | 14.6 | 7.2 | 0.67 | Columnar | 8.0 | 0.12 | 34 | 123.5 |

| | | Crystal Composition (Mass Ratio) of First Layer [TiCN Layer] | | | | | |
|---|---|---|---|---|---|---|---|
| | Average Thickness of W-Diffused | Metal Composition of Crystal Grain Boundaries $[Ti_{x_1}W_{y_1}Co_{z_1}]$ | | | Metal Composition of Crystal Grains $[Ti_{x_2}W_{y_2}Co_{z_2}]$ | | |
| No. | Layer (nm) | $x_1$ | $y_1$ | $z_1$ | $x_2$ | $y_2$ | $z_2$ |
| Example 1 | 68 | 0.47 | 0.43 | 0.10 | 0.86 | 0.11 | 0.03 |
| Example 22 | 32 | 0.74 | 0.21 | 0.05 | 1.00 | 0.00 | 0.00 |
| Example 23 | 55 | 0.56 | 0.35 | 0.09 | 0.95 | 0.04 | 0.01 |
| Example 24 | 90 | 0.41 | 0.47 | 0.12 | 0.87 | 0.10 | 0.03 |
| Example 25 | 132 | 0.39 | 0.49 | 0.12 | 0.80 | 0.16 | 0.04 |
| Example 26 | 145 | 0.40 | 0.48 | 0.12 | 0.77 | 0.18 | 0.05 |

Note:
[1] Thickness.
[2] Average transverse cross section diameter.
[3] Hardness.
[4] The position (2θ) of a peak of a (422) plane.

TABLE 9

| | Evaluation of Cutting | |
|---|---|---|
| No. | Chipping [1] | Life[2] (minute) |
| Example 1 | No | 40 |
| Example 22 | No | 10 |
| Example 23 | No | 25 |
| Example 24 | No | 35 |
| Example 25 | Yes | 10 |
| Example 26 | Yes | 10 |

Note:
[1] The presence of chipping when reaching the tool life.
[2] Tool life

The hard-coated inserts of Examples 22-26 had tool lives of 10 minutes or more, 2 times or more longer than those of Comparative Examples 1-8. The coatings of Examples 25 and 26 thicker than those of Examples 22-24 had slightly shorter lives due to the chipping of cutting edges to which a work was seized, though chipping did not occur in an early stage of cutting.

Example 27

First Layer+Second Layer

A first layer was formed directly on the same substrate as in Example 1 in the same manner as in Example 1. A starting material gas having a composition comprising 83.0% by volume of a $H_2$ gas, 15.0% by volume of a $N_2$ gas, 1.5% by volume of a $TiCl_4$ gas, and 0.5% by volume of an $CH_3CN$ gas was then continuously supplied at a flow rate of 6,600 ml/minute to a CVD furnace with a substrate temperature of 700° C. as shown in Table 10, so that a second layer (titanium carbonitride layer) having an average thickness of 1.0 μm was formed by a chemical vapor deposition method with a starting material gas pressure of 8 kPa, thereby producing a hard-coated insert. With respect to this insert, the properties of the second layer measured by the same method as in Example 1 are shown in Table 10, and their cutting evaluation results are shown in Table 12.

Examples 28 and 29

First Layer+Second Layer

A first layer was formed directly on the same substrate as in Example 1 in the same manner as in Example 1. A second layer (titanium carbonitride layer) having an average thickness of 1.0 μm was then continuously formed by a chemical vapor deposition method in the same manner as in Example 27, except for changing the substrate temperature to 850° C. (Example 28) and 1,000° C. (Example 29) in the formation of the second layer as shown in Table 10, thereby producing hard-coated inserts. With respect to these inserts, the properties of the second layers measured in the same manner as in Example 1 are shown in Table 10, and their cutting evaluation results are shown in Table 12.

Example 30

First Layer+First Upper Layer

A first layer was formed directly on the same substrate as in Example 1 in the same manner as in Example 1. In the formation of a first upper layer (TiZrCN layer), as shown in Table 11, a starting material gas having a composition comprising 77.5% by volume of a $H_2$ gas, 20.0% by volume of a $N_2$ gas, 0.5% by volume of a $TiCl_4$ gas, 1.0% by volume of an $CH_3CN$ gas, and 1.0% by volume of a $ZrCl_4$ gas was then continuously supplied at a flow rate of 6,600 ml/minute to a CVD furnace with a substrate temperature of 850° C., to form a first upper layer having an average thickness of 1.0 μm by a chemical vapor deposition method at a starting material gas pressure of 8 kPa, thereby producing a hard-coated insert. With respect to this insert, the properties measured in the same manner as in Example 1 are shown in Table 11, and the performance evaluation results are shown in Table 12.

Examples 31-37

First Layer+First Upper Layer

Each first layer was formed directly on the same substrate as in Example 1 in the same manner as in Example 1. Each first upper layer having an average thickness of 1.0 μm was then continuously formed by a chemical vapor deposition method under the film-forming conditions of a substrate temperature, and the composition and pressure of a starting material gas shown in Table 11, thereby producing a hard-coated insert. With respect to these inserts, the properties measured in the same manner as in Example 1 are shown in Table 11, and the performance evaluation results are shown in Table 12.

TABLE 10

| | Conditions of Forming Second Layer [TiCN Layer] | | | | | | |
|---|---|---|---|---|---|---|---|
| | Substrate Temperature | Starting Material Gas Pressure | Composition (% by volume) of Starting Material Gas | | | | |
| No. | (° C.) | (kPa) | $H_2$ | $N_2$ | $TiCl_4$ | $CH_3CN$ | $C_2H_6$ |
| Example 27 | 800 | 8 | 83.0 | 15.0 | 1.5 | 0.5 | — |
| Example 28 | 850 | 8 | 83.0 | 15.0 | 1.5 | 0.5 | — |
| Example 29 | 1000 | 8 | 82.0 | 15.0 | 1.5 | — | $CH_4$: 1.5 |

| | Properties of Second Layer [TiCN Layer] | | | | | | | |
|---|---|---|---|---|---|---|---|---|
| | Composition (% by mass) | | | | | Thickness | $d^{(1)}$ | Hardness |
| No. | Ti | C | N | C/(C + N) | Structure | (μm) | (μm) | (GPa) |
| Example 27 | 79.4 | 11.3 | 9.3 | 0.55 | Columnar | 1.0 | 0.10 | 31 |
| Example 28 | 78.4 | 12.4 | 9.2 | 0.57 | Columnar | 1.0 | 0.12 | 33 |
| Example 29 | 79.0 | 11.0 | 10.0 | 0.52 | Columnar | 1.0 | 0.22 | 30 |

Note:
[1] Average transverse cross section diameter.

TABLE 11

| | | Conditions of Forming First Upper Layer | | | | | | |
|---|---|---|---|---|---|---|---|---|
| | | Substrate | Starting Material Gas | Starting Material Gas Composition (% by volume) | | | | |
| No. | Type | Temp. (° C.) | Pressure (kPa) | $H_2$ | $N_2$ | $TiCl_4$ | $CH_3CN$ | Other Gas/ Concentration |
| Example 30 | TiZrCN | 850 | 8 | 77.5 | 20.0 | 0.5 | 1.0 | $ZrCl_4$/1.0 |
| Example 31 | TiAlCN | 800 | 8 | 77.0 | 20.0 | 0.5 | 1.0 | $AlCl_3$/1.0, $NH_3$/0.5 |
| Example 32 | TiSiCN | 950 | 5 | 77.0 | 20.0 | 0.5 | 1.0 | $SiCl_4$/1.0, $NH_3$/0.5 |
| Example 33 | TiN | 950 | 10 | 74.0 | 25.0 | 1.0 | — | — |
| Example 34 | TiAlN | 750 | 5 | 78.0 | 20.0 | 0.5 | — | $AlCl_3$/1.0, $NH_3$/0.5 |
| Example 35 | TiAlSiN | 850 | 5 | 77.5 | 20.0 | 0.5 | — | $AlCl_3$/1.0, $SiCl_4$/0.5, $NH_3$/0.5 |
| Example 36 | TiC | 1000 | 10 | 93.0 | — | 2.0 | — | $CH_4$/5.0 |
| Example 37 | ZrN | 1020 | 5 | 73.5 | 25.0 | — | — | $ZrCl_4$/1.5 |

| | Properties of First Upper Layer | | | | | | | |
|---|---|---|---|---|---|---|---|---|
| | Composition (% by mass) | | | | | | Thickness | $d^{(1)}$ |
| No. | Ti | Me$^{(2)}$ | C | N | C/(C + N) | Structure | (μm) | (μm) |
| Example 30 | 76.0 | Zr 4.5 | 12.3 | 7.2 | 0.63 | Columnar | 1.0 | 0.15 |
| Example 31 | 73.2 | Al 8.2 | 12.1 | 6.5 | 0.65 | Columnar | 1.0 | 0.18 |
| Example 32 | 76.9 | Si 35 | 12.4 | 7.2 | 0.65 | Columnar | 1.0 | 0.19 |
| Example 33 | 76.5 | — | — | 23.5 | 0 | Granular | 1.0 | —$^{(2)}$ |
| Example 34 | 50.8 | Al 25.0 | — | 24.2 | 0 | Granular | 1.0 | —$^{(2)}$ |
| Example 35 | 65.7 | AlSi 12.0 | — | 22.3 | 0 | Granular | 1.0 | —$^{(2)}$ |
| Example 36 | 75.5 | — | 24.5 | — | — | Granular | 1.0 | —$^{(2)}$ |
| Example 37 | — | Zr 76.2 | — | 23.8 | 0 | Granular | 1.0 | —$^{(2)}$ |

Note:
$^{(1)}$Average transverse cross section diameter.
$^{(2)}$The element Me is Zr, Al, Si, Al + Si, or Zr.

TABLE 12

| | Evaluation of Cutting | |
|---|---|---|
| No. | Chipping$^{(1)}$ | Life$^{(2)}$ (minute) |
| Example 1 | No | 40 |
| Example 27 | No | 25 |
| Example 28 | No | 30 |
| Example 29 | No | 20 |
| Example 30 | No | 35 |
| Example 31 | No | 35 |
| Example 32 | No | 25 |
| Example 33 | No | 25 |
| Example 34 | No | 30 |
| Example 35 | No | 30 |
| Example 36 | No | 25 |
| Example 37 | No | 25 |
| Com. Ex. 1 | Yes | 3 |

Note:
$^{(1)}$The presence of chipping when reaching the tool life.
$^{(2)}$Tool life.

As is clear from Table 12, Examples 27-37 were 2 times or more longer in a tool life than Comparative Example 1.

Example 38

First Layer+Second Layer+Second Upper Layer
(Bonding Layer+Oxide Layer)

A first layer was formed directly on the same substrate as in Example 1 in the same manner as in Example 1. As shown in Table 13, a starting material gas comprising 88.0% by volume of a $H_2$ gas, 10.0% by volume of a $N_2$ gas, 1.5% by volume of a $TiCl_4$ gas, and 0.5% by volume of an $CH_3CN$ gas was then continuously supplied at a flow rate of 6,600 ml/minute to a CVD furnace with a substrate temperature of 850° C., to form a second layer having an average thickness of 1.0 μm by a chemical vapor deposition method at a starting material gas pressure of 8 kPa.

Thereafter, to form a bonding layer comprising a Ti(CN) layer and a Ti(CNO) layer, a starting material gas having a composition comprising 63.5% by volume of a $H_2$ gas, 32.0% by volume of a $N_2$ gas, 3.2% by volume of a $CH_4$ gas, and 1.3% by volume of a $TiCl_4$ gas was supplied at a flow rate of 6,300 ml to the CVD furnace with a substrate temperature of 1,000° C., to form a Ti(CN) layer having an average thickness of 0.5 μm as a second layer at a starting material gas pressure of 20 kPa. A starting material gas having a composition comprising 61.3% by volume of a $H_2$ gas, 30.7% by volume of a $N_2$ gas, 3.0% by volume of a $CH_4$ gas, 1.2% by volume of a $TiCl_4$ gas, 3.0% by volume of a CO gas, and 0.8% by volume of a $CO_2$ gas was continuously supplied at a flow rate of 6,500 ml/minute to the CVD furnace with a substrate temperature of 1,000° C., to form a Ti(CNO) layer having an average thickness of 0.5 μm on the side of an $Al_2O_3$ layer at a starting material gas pressure of 20 kPa.

A starting material gas having a composition comprising 9.2% by volume of an $AlCl_3$ gas, 85.3% by volume of a $H_2$ gas, 4.3% by volume of a $CO_2$ gas, 0.2% by volume of $H_2S$ gas, and 1.0% by volume of HCl gas was then supplied at a flow rate of 4,700 ml to the CVD furnace with a substrate temperature of 1,010° C., to form an α-aluminum oxide layer having an average thickness of 1 μm at a starting material gas pressure of 10 kPa. A wet-blasting treatment was then conducted in the same manner as in Example 1. The properties of the second layer measured in the same manner as in Example 1 are shown in Table 13, and their cutting evaluation results are shown in Table 14.

TABLE 13

| | Conditions of Forming Second Layer [TiCN Layer] | | | | | |
|---|---|---|---|---|---|---|
| | Substrate Temperature | Starting Material Gas Pressure (kPa) | Starting Material Gas Composition (% by volume) | | | |
| No. | (° C.) | | $H_2$ | $N_2$ | $TiCl_4$ | $CH_3CN$ |
| Example 38 | 850 | 8 | 88.0 | 10.0 | 1.5 | 0.5 |

| | Composition And Properties of Second Layer [TiCN Layer] | | | | | | | |
|---|---|---|---|---|---|---|---|---|
| | Composition (% by mass) | | | | | Thickness | $d^{(1)}$ | Hardness |
| No. | Ti | C | N | C/(C + N) | Structure | (μm) | (μm) | (GPa) |
| Example 38 | 78.7 | 12.4 | 8.9 | 0.58 | Columnar | 1.0 | 0.11 | 33 |

Note:
(1)Average transverse cross section diameter.

TABLE 14

| | Second Upper Layer | | | Evaluation | |
|---|---|---|---|---|---|
| | Bonding Layer | | | of Cutting | |
| No. | On Second Layer Side | On $Al_2O_3$ Layer Side | Oxide Layer | Chipping(1) | Life(2) (minute) |
| Example 28 | — | — | — | No | 30 |
| Example 38 | Ti(CN) | Ti(CNO) | α-$Al_2O_3$ | Yes | 10 |
| Com. Ex. 1 | — | — | — | Yes | 3 |

Note:
(1)The presence of chipping when reaching the tool life.
(2)Tool life.

As is clear from Table 14, Example 38 was 2 times or more longer in tool life than Comparative Example 1. The comparison of Examples 28 and 38 indicates that Example 38 was thicker than Example 28 because of the addition of the second upper layer, and exhibited a slightly shorter life because chipping occurred in a cutting edge due to a work's seizure as wearing proceeded in the hard coating.

Example 39

(1) Production of Milling Insert Coated with First Layer (Titanium Carbonitride Layer), Second Layer (Titanium Carbonitride Layer), and Second Upper Layer (Bonding Layer and Oxide Layer)

Figure 11:
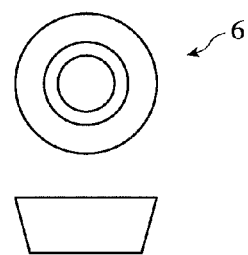
FIG. 11 is a schematic view showing the front and side shapes of a milling insert.

A milling insert substrate (RDMT10T3M0TN) 6 of WC-based cemented carbide having a composition of 11.5% by mass of Co, 1.5% by mass of TaC, 0.7% by mass of Cr, 86.3% by mass of WC and inevitable impurities, and a property-evaluating insert substrate (SEE42TN-G9) 2, which were shown in FIG. 11, were honed.

With two types of these insert substrates 6, 2 set in a CVD furnace, a substrate temperature in the CVD furnace was elevated to 850° C. while supplying a $H_2$ gas. A starting material gas comprising 81.7% by volume of a $H_2$ gas, 15.0% by volume of a $N_2$ gas, 1.5% by volume of a $TiCl_4$ gas, 0.5% by volume of an $CH_3CN$ gas, and 1.3% by volume of an $C_2H_6$ gas was then supplied at a flow rate of 6,700 ml/minute to the CVD furnace with a substrate temperature of 850° C., to form a titanium carbonitride layer (first layer) having an average thickness of 2.0 μm directly on each insert substrate 6, 2 by a chemical vapor deposition method at a starting material gas pressure of 7 kPa. At 850° C. and 7 kPa, a starting material gas comprising 88.0% by volume of a $H_2$ gas, 10.0% by volume of a $N_2$ gas, 1.5% by volume of a $TiCl_4$ gas, and 0.5% by volume of an $CH_3CN$ gas was then continuously supplied at a flow rate of 6,600 ml/minute to the CVD furnace, to form a titanium carbonitride layer (second layer) having an average thickness of 1.5 μm by a chemical vapor deposition method.

Thereafter, to form a bonding layer comprising a Ti(CN) layer and a Ti(CNO) layer, a starting material gas comprising 63.5% by volume of a $H_2$ gas, 32.0% by volume of a $N_2$ gas, 3.2% by volume of a $CH_4$ gas, and 1.3% by volume of a $TiCl_4$ gas was supplied at a flow rate of 6,300 ml/minute to the CVD furnace with a substrate temperature of 1,000° C., to form a Ti(CN) layer having an average thickness of 0.5 μm at a starting material gas pressure of 20 kPa. A starting material gas comprising 61.3% by volume of a $H_2$ gas, 30.7% by volume of a $N_2$ gas, 3.0% by volume of a $CH_4$ gas, 1.2% by volume of a $TiCl_4$ gas, 3.0% by volume of a CO gas, and 0.8% by volume of a $CO_2$ gas was continuously supplied at a flow rate of 6,500 ml/minute to the CVD furnace with a substrate temperature of 1,000° C., to form a Ti(CNO) layer having an average thickness of 0.5 μm at a starting material gas pressure of 20 kPa.

At a substrate temperature of 1,010° C., a starting material gas comprising 9.2% by volume of an $AlCl_3$ gas, 85.3% by volume of a $H_2$ gas, 4.3% by volume of a $CO_2$ gas, 0.2% by volume of a $H_2S$ gas, and 1.0% by volume of a HCl gas was supplied at a flow rate of 4,700 ml/minute to the CVD furnace, to form an α-aluminum oxide layer having an average thickness of 2 μm at a starting material gas pressure of 10 kPa. The entire surface of the α-aluminum oxide layer of the insert was wet-blasted with a slurry containing $Al_2O_3$ powder having an average diameter of 30 μm at a impinging pressure of 0.30 MPa, to obtain a hard-coated milling insert.

(2) Measurement of Thickness

The average thickness of each of the first and second layers, the bonding layer and the α-aluminum oxide layer was determined by grinding each layer slantingly with an angle of 2° to obtain a lapped surface, which was etched with a Murakami's reagent, observing the etched surface by an optical microscope of 1,000 times to measure the thickness of each layer at five optional points, and averaging the measured data. The first and second layers can be discerned by brightness difference reflected by the composition difference of their starting material gases.

(3) Measurement of Crystal Structure

Figure 13B:
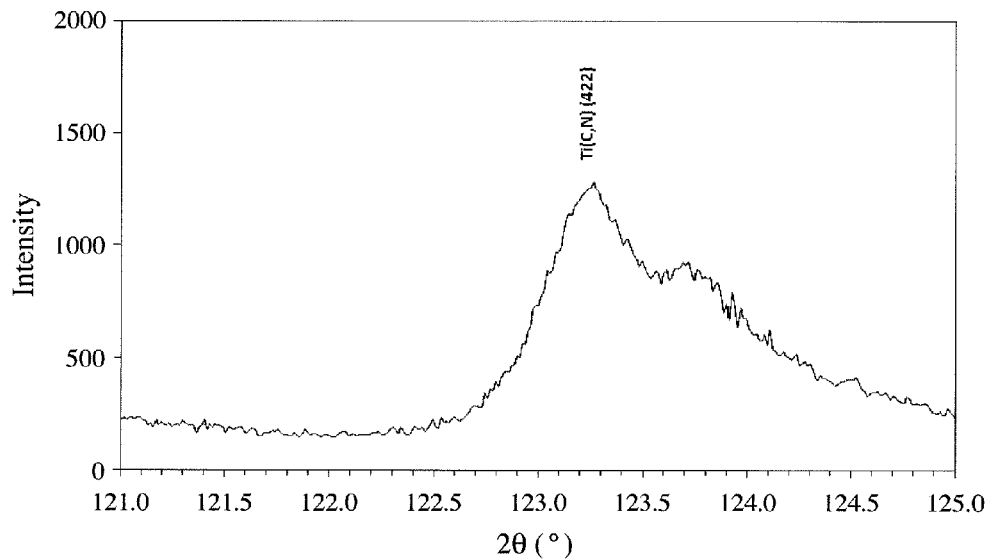
FIG. 13(b) is an enlarged graph showing part of the X-ray diffraction pattern of FIG. 13(a) in a 2θ range of 121.0-125.0°.

As in Example 1, a rake face of the above milling insert [property-evaluating milling insert (SEE42TN-G9)] 2 of the present invention was irradiated with X-rays to measure its crystal structure. FIG. 13(a) shows the measured X-ray diffraction pattern in a 2θ range of 10-145°. FIG. 13(b) enlargedly shows part of the X-ray diffraction pattern of FIG. 13(a) in a 2θ range of 121.0-125.0°, indicating that the highest diffraction peak of a (422) plane of the titanium carbonitride layer was in a 2θ range from 123.0° to 123.5°. In the X-ray diffraction pattern of FIG. 13(a), diffraction peaks of α-aluminum oxide together with those of Ti(CN) were observed.

Figure 14:
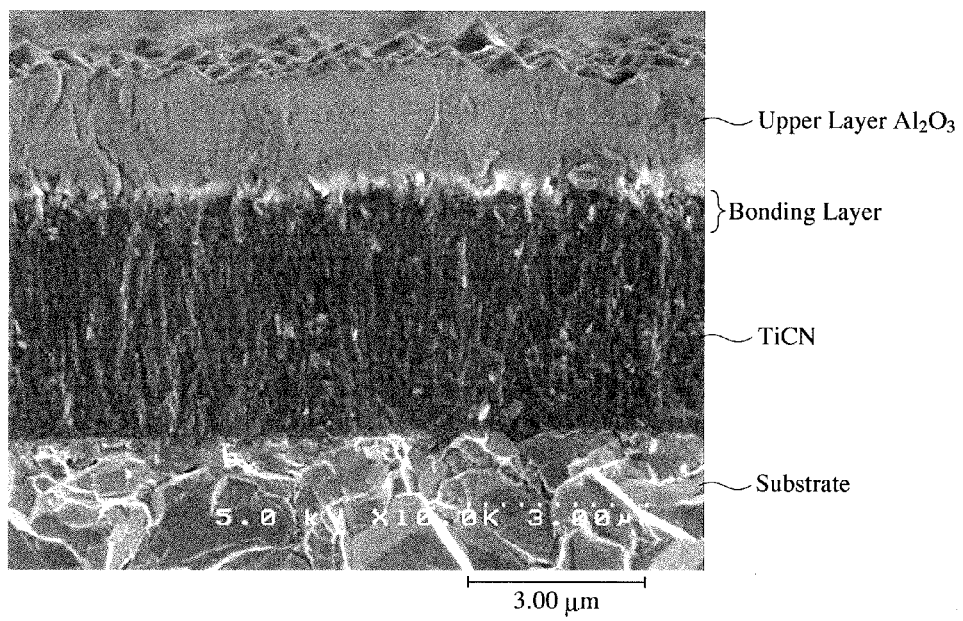
FIG. 14 is a SEM photograph (magnification: 10,000 times) showing a fractured cross section structure of the hard-coated insert of Example 39.

(4) Observation of Crystal Structures of First and Second Layers (Titanium Carbonitride Layers), and Measurement of Average Transverse Cross Section Diameter of Columnar Crystal Grains Using a scanning electron microscope (SEM, S-4200 available from Hitachi, Ltd., magnification: 10,000 times), a fractured cross section of a hard coating on the honed cutting edge of the property-evaluating milling insert (SEE42TN-G9) was observed. As a result, it was confirmed as shown in FIG. 14 that the titanium carbonitride layers (the first and second layers) had a columnar crystal structure.

(5) Measurement of Composition

The amounts of Ti, C and N in the first and second layers and the second upper layer were measured in the same manner as in Example 1. The compositions of crystal grain boundaries and crystal grains in the thin lower layer and the immediately upper layer were analyzed by an energy-dispersive X-ray spectrometer (EDS) attached to a field-emission transmission electron microscope (TEM, JEM-2010F available from JEOL Ltd.), and a scanning auger electron microscope (SMART200 available from PHI, acceleration voltage: 10 kV, sample current: 10 nA, and electron probe diameter: 0.1 μm or less). Each composition analysis by EPMA, EDS and auger electron spectroscopy (AES) was conducted at 5 arbitrary center points in a thickness direction, and averaged.

(6) Measurement of Average Thickness of W-Diffused Layer

The average thickness of a W-diffused layer in the first layer (titanium carbonitride layer) was measured in the same manner as in Example 1. As a result, the average thickness of the W-diffused layer in the first layer was 90 nm. The mass ratios of metal components in the first layer were $x_1=0.40$, $y_1=0.48$, and $z_1=0.12$ in crystal grain boundaries, and $x_2=0.83$, $y_2=0.12$, $z_2=0.03$ in crystal grains. Their measurement results are shown in Table 15.

(7) Measurement of Hardness

By a nano-indentation method using a nano indentation tester (ENT-1100 available from Elionix Inc.) with a single crystal of Si as a standard sample, the hardness of the first and second layers was measured 5 times at center in a thickness direction, and averaged. The measurement conditions were a maximum load of 4900 mN, a load speed of 49 mN/second, and a load-keeping time of 1 second. The results are shown in Tables 15 and 16.

(8) Evaluation of Performance

Figure 12:
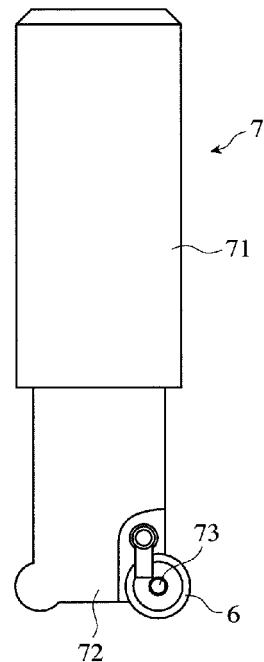
FIG. 12 is a schematic view showing an indexable rotary tool, to which the inserts of FIG. 11 are attached.

With each of the resultant milling inserts 6 attached to a tip end portion 72 of a tool body 71 of an indexable rotary tool 7 by a fastening screw 73 as shown in FIG. 12, the peeling of a hard coating and the tool life were evaluated under the following milling conditions. The insert 6 may be fastened by a known means such as a clamp, etc.

Using a work of SUS316, a difficult-to-cut material, the peeling of a hard coating and the tool life were evaluated under the following milling conditions. The flank wear width and chipping of the hard coating were evaluated by observation with an optical microscope (magnification: 100 times). The tool life was determined by a working time until the maximum wear width of a flank exceeded 0.350 mm, or until chipping occurred. The results are shown in Table 17.

Work: SUS316 (austenitic stainless steel),
Machining method: Continuous milling,
Tool used: ARS3032R,
Insert shape: RDMT10T3M0TN,
Cutting speed: 200 m/minute,
Feed: 0.20 mm/tooth,
Cutting depth in Z direction: 1 mm,
Cutting depth in radial direction: 16 mm,
Single-edge machining, and
Air blowing.

Comparative Examples 11 and 12

Hard-coated cutting inserts were produced in the same manner as in Example 39 except for changing the forming conditions of the first and second layers as shown in Tables 18 and 19, and their properties and performance were measured. In Comparative Example 11, a starting material gas containing no $CH_3CN$ gas was used. In Comparative Example 12, a starting material gas containing no $C_2H_6$ gas was used.

With respect to Example 39, the forming conditions and properties of the first layer are shown in Table 15, the forming conditions and properties of the second layer are shown in Table 16, and the structures of the bonding layer and the oxide layer and their cutting evaluation results are shown in Table 17.

With respect to Comparative Examples 11 and 12, the forming conditions and properties of the first layers are shown in Table 18, and the structure of the bonding layers and their cutting evaluation results are shown in Table 19.

TABLE 15

Conditions of Forming First Layer [TiCN Layer]

| No. | Substrate Temperature (° C.) | Starting Material Gas Pressure (kPa) | Starting Material Gas Composition (% by volume) | | | | |
|---|---|---|---|---|---|---|---|
| | | | $H_2$ | $N_2$ | $TiCl_4$ | $CH_3CN$ | $C_2H_6$ |
| Example 39 | 850 | 7 | 81.7 | 15 | 1.5 | 0.5 | 1.3 |

Properties of First Layer [TiCN Layer]

| No. | Composition (% by mass) | | | | Structure | $T^{(1)}$ (μm) | $d^{(2)}$ (μm) | $H^{(3)}$ (GPa) | Peak$^{(4)}$ of (422) Plane |
|---|---|---|---|---|---|---|---|---|---|
| | Ti | C | N | C/(C + N) | | | | | |
| Example 39 | 78.3 | 14.9 | 6.8 | 0.69 | Columnar | 2.0 | 0.09 | 35 | 123.3 |

Crystal Composition (Mass Ratio) of First Layer [TiCN Layer]

| No. | Average Thickness of W-Diffused Layer (nm) | Metal Composition of Crystal Grain Boundaries [$Tix_1Wy_1Coz_1$] | | | Metal Composition of Crystal Grains [$Tix_2Wy_2Coz_2$] | | |
|---|---|---|---|---|---|---|---|
| | | $x_1$ | $y_1$ | $z_1$ | $x_2$ | $y_2$ | $z_2$ |
| Example 39 | 90 | 0.40 | 0.48 | 0.12 | 0.85 | 0.12 | 0.03 |

Note:
$^{(1)}$Thickness.
$^{(2)}$Average transverse cross section diameter.
$^{(3)}$Hardness.
$^{(4)}$The position (2θ) of a peak of a (422) plane.

TABLE 16

Conditions of Forming Second Layer [TiCN Layer]

| No. | Substrate Temperature (° C.) | Starting Material Gas Pressure (kPa) | Starting Material Gas Composition (% by volume) | | | | |
|---|---|---|---|---|---|---|---|
| | | | $H_2$ | $N_2$ | $TiCl_4$ | $CH_3CN$ | $C_2H_6$ |
| Example 39 | 850 | 7 | 88.0 | 10.0 | 1.5 | 0.5 | — |

Composition And Properties of Second Layer [TiCN Layer]

| No. | Composition (% by mass) | | | | Structure | Thickness (μm) | $d^{(1)}$ (μm) | Hardness (GPa) |
|---|---|---|---|---|---|---|---|---|
| | Ti | C | N | C/(C + N) | | | | |
| Example 39 | 78.4 | 13.0 | 8.6 | 0.60 | Columnar | 1.5 | 0.10 | 35 |

Note:
$^{(1)}$Average transverse cross section diameter.

TABLE 17

| No. | Bonding Layer | | | Evaluation of Cutting | |
|---|---|---|---|---|---|
| | Bonding Layer | | Oxide Layer | Chipping$^{(1)}$ | Life$^{(2)}$ (minute) |
| | On Second Layer Side | On $Al_2O_3$ Layer Side | | | |
| Example 39 | Ti(CN) | Ti(CNO) | α-$Al_2O_3$ | No | 25 |

Note:
$^{(1)}$The presence of chipping when reaching the tool life.
$^{(2)}$Tool life.

TABLE 18

Conditions of Forming First Layer [TiCN Layer]

| No. | Substrate Temperature (° C.) | Starting Material Gas Pressure (kPa) | Starting Material Gas Composition (% by volume) | | | | Hydrocarbon Gas/ Concentration |
|---|---|---|---|---|---|---|---|
| | | | $H_2$ | $N_2$ | $TiCl_4$ | $CH_3CN$ | |
| Com. Ex. 11 | 850 | 7 | 64.5 | 32.2 | 2.0 | 0.0 | $C_2H_6$/1.3 |
| Com. Ex. 12 | 850 | 7 | 82.0 | 15.0 | 1.5 | 1.5 | — |

Properties of First Layer [TiCN Layer]

| No. | Composition (% by mass) | | | | Structure | $T^{(1)}$ (μm) | $d^{(2)}$ (μm) | $H^{(3)}$ (GPa) | Peak$^{(4)}$ of (422) Plane |
|---|---|---|---|---|---|---|---|---|---|
| | Ti | C | N | C/(C + N) | | | | | |
| Com. Ex. 11 | 78.5 | 17.1 | 4.4 | 0.80 | Columnar | 3.5 | 0.10 | 39 | 122.5 |
| Com. Ex. 12 | 78.0 | 12.8 | 9.2 | 0.58 | Columnar | 3.5 | 0.52 | 27 | 123.6 |

Crystal Composition (Mass Ratio) of First Layer [TiCN Layer]

| No. | Average Thickness of W-Diffused Layer (nm) | Metal Composition of Crystal Grain Boundaries [$Tix_1Wy_1Coz_1$] | | | Metal Composition of Crystal Grains [$Tix_2Wy_2Coz_2$] | | |
|---|---|---|---|---|---|---|---|
| | | $x_1$ | $y_1$ | $z_1$ | $x_2$ | $y_2$ | $z_2$ |
| Com. Ex. 11 | 2345 | 0.10 | 0.65 | 0.25 | 0.56 | 0.24 | 0.20 |
| Com. Ex. 12 | 7 | 0.88 | 0.09 | 0.03 | 1.00 | 0.00 | 0.00 |

Note:
$^{(1)}$Thickness.
$^{(2)}$Average transverse cross section diameter.
$^{(3)}$Hardness.
$^{(4)}$The position (2θ) of a peak of a (422) plane.

TABLE 19

| No. | Second Upper Layer | | | Evaluation of Cutting | |
|---|---|---|---|---|---|
| | Bonding Layer | | Oxide Layer | Chipping$^{(1)}$ | Life$^{(2)}$ (minute) |
| | On Second Layer Side | On $Al_2O_3$ Layer Side | | | |
| Com. Ex. 11 | Ti(CN) | Ti(CNO) | α-$Al_2O_3$ | Yes | 3 |
| Com. Ex. 12 | Ti(CN) | Ti(CNO) | α-$Al_2O_3$ | No | 5 |

Note:
$^{(1)}$The presence of chipping when reaching the tool life.
$^{(2)}$Tool life.

The tool life of the hard-coated insert of Example 39 was 25 minutes, 2 times or more longer than those of Comparative Examples 11 and 12, indicating extremely high performance. This is due to the fact that the average thickness of a W-diffused layer in a range of 30-200 nm in the hard-coated insert of Example 39 provides high adhesion to a WC-based cemented carbide substrate and the suppressed embrittlement of the substrate, resulting in excellent chipping resistance, high hardness of the first layer (titanium carbonitride layer) and excellent wear resistance.

On the other hand, the average thickness of a W-diffused layer was more than 1,000 nm in the insert of Comparative Example 11, so that a work was seized to the cutting edge, and that peeling occurred between the first layer and part of the substrate by repeated detachment of the seized work material, causing chipping, and thus resulting in a short tool life. Because the diffusion of W, a substrate component, was less than 30 nm in the insert of Comparative Example 12, there was poor adhesion between the substrate and the first layer, which caused the peeling of the first layer, resulting in a short tool life.

Examples 40-42

Average Thickness of First Layer

Each first layer as thick as 0.9-5.0 μm and each second layer as thick as 1.0-2.6 μm were formed directly on the same substrate as in Example 39 in the same manner as in Example 39, except for changing only the forming time of the first and second layers. A bonding layer and an α-aluminum oxide layer were then continuously formed in the same manner as in Example 39. Thereafter, a wet-blasting treatment was conducted to produce the milling inserts of the present invention, and their properties and performance were evaluated.

With respect to Examples 40-42, the properties of the first layers (titanium carbonitride layers) are shown in Table 20, the thickness of the second layers is shown in Table 21, and the structures of the second upper layers and their cutting evaluation results are shown in Table 22.

TABLE 20

Composition and Properties of First Layer [TiCN Layer]

| No. | Composition (% by mass) | | | | Structure | $T^{(1)}$ (μm) | $d^{(2)}$ (μm) | $H^{(3)}$ (GPa) | Peak$^{(4)}$ of (422) Plane |
|---|---|---|---|---|---|---|---|---|---|
| | Ti | C | N | C/(C + N) | | | | | |
| Example 39 | 76.5 | 14.7 | 8.8 | 0.63 | Columnar | 2.0 | 0.12 | 34 | 123.5 |
| Example 40 | 76.9 | 14.5 | 8.6 | 0.63 | Columnar | 0.9 | 0.08 | 34 | 123.4 |

TABLE 20-continued

| | | | | | | | | |
|---|---|---|---|---|---|---|---|---|
| Example 41 | 76.6 | 14.6 | 8.8 | 0.62 | Columnar | 1.5 | 0.14 | 34 | 123.5 |
| Example 42 | 76.9 | 14.6 | 8.5 | 0.63 | Columnar | 5.0 | 0.15 | 34 | 123.5 |

| | | Crystal Composition (Mass Ratio) of First Layer [TiCN Layer] | | | | | |
|---|---|---|---|---|---|---|---|
| | Average Thickness of W-Diffused | Metal Composition of Crystal Grain Boundaries $[Ti x_1 W y_1 Co z_1]$ | | | Metal Composition of Crystal Grains $[Ti x_2 W y_2 Co z_2]$ | | |
| No. | Layer (nm) | $x_1$ | $y_1$ | $z_1$ | $x_2$ | $y_2$ | $z_2$ |
| Example 39 | 90 | 0.40 | 0.48 | 0.12 | 0.83 | 0.12 | 0.05 |
| Example 40 | 81 | 0.68 | 0.24 | 0.08 | 0.95 | 0.03 | 0.02 |
| Example 41 | 93 | 0.65 | 0.26 | 0.09 | 0.91 | 0.06 | 0.03 |
| Example 42 | 95 | 0.40 | 0.53 | 0.07 | 0.81 | 0.14 | 0.05 |

Note:
[1]Thickness.
[2]Average transverse cross section diameter.
[3]Hardness.
[4]The position (2θ) of a peak of a (422) plane.

TABLE 21

| | Second Layer | |
|---|---|---|
| No. | Type | Thickness (μm) |
| Example 39 | TiCN | 1.5 |
| Example 40 | TiCN | 2.6 |
| Example 41 | TiCN | 2.0 |
| Example 42 | TiCN | 1.0 |

TABLE 22

| | Second Upper Layer | | | Evaluation of Cutting | |
|---|---|---|---|---|---|
| | Bonding Layer | | | | |
| No. | On Second Layer Side | On $Al_2O_3$ Layer Side | Oxide Layer | Chipping[1] | Life[2] (minute) |
| Example 39 | Ti(CN) | Ti(CNO) | α-$Al_2O_3$ | No | 25 |
| Example 40 | Ti(CN) | Ti(CNO) | α-$Al_2O_3$ | No | 10 |
| Example 41 | Ti(CN) | Ti(CNO) | α-$Al_2O_3$ | No | 20 |
| Example 42 | Ti(CN) | Ti(CNO) | α-$Al_2O_3$ | No | 15 |
| Com. Ex. 11 | Ti(CN) | Ti(CNO) | α-$Al_2O_3$ | Yes | 3 |

Note:
[1]The presence of chipping when reaching the tool life.
[2]Tool life

As is clear from Table 22, when the first layers (titanium carbonitride layers) have an average thickness of 1-5 μm, the tool lives were 15 minutes or more, high performance that cannot be achieved conventionally.

Example 43

Substitution of $C_2H_6$ Gas with $CH_4$ Gas

The milling insert of the present invention was produced in the same manner as in Example 39, except that 25% by volume of an $C_2H_6$ gas as a hydrocarbon gas in the starting material gas for the first layer was substituted with a $CH_4$ gas as shown in Table 23, and cutting evaluation was conducted. The results are shown in Table 23.

Example 44

The milling insert of the present invention was produced in the same manner as in Example 39, except that 45% by volume of an $C_2H_6$ gas as a hydrocarbon gas in the starting material gas for the first layer was substituted with a $CH_4$ gas as shown in Table 23, and cutting evaluation was conducted. The results are shown in Table 23.

Comparative Example 13

The milling insert of Comparative Example 13 was produced in the same manner as in Example 39, except that the entire hydrocarbon gas in the starting material gas for the first layer was substituted with a $CH_4$ gas as shown in Table 23, and cutting evaluation was conducted. The results are shown in Table 23.

TABLE 23

| | Starting Material Gas Composition (% by volume) for First Layer | | | | | | Evaluation of Cutting | |
|---|---|---|---|---|---|---|---|---|
| | | | | | Hydrocarbon Gas/Concentration | | | |
| No. | $H_2$ | $N_2$ | $TiCl_4$ | $CH_3CN$ | $C_2H_6$ | $CH_4$ | Peeling[1] | Life[2] (minute) |
| Example 39 | 81.3 | 15.0 | 1.5 | 1.0 | 1.2 | — | No | 25 |
| Example 43 | 81.3 | 15.0 | 1.5 | 1.0 | 0.9 | 0.3 | No | 16 |
| Example 44 | 81.3 | 15.0 | 1.5 | 1.0 | 0.66 | 0.54 | No | 12 |
| Com. Ex. 13 | 81.3 | 15.0 | 1.5 | 1.0 | — | 1.2 | Yes | 5 |

Note:
[1]Peeling after cutting for 2 minutes.
[2]Tool life.

As is clear from Table 23, the hard-coated inserts of Examples 43 and 44 produced with 25% and 45% by volume of an $C_2H_6$ gas as a hydrocarbon gas in the starting material gas for the first layer substituted with a $CH_4$ gas had excellent cutting performance. On the other hand, the hard-coated insert of Comparative Example 13 produced with 100% by volume of a $CH_4$ gas as a hydrocarbon gas had a short life.

Effects of the Invention (1) In the hard-coated tool of the present invention, W, etc., substrate components, are diffused from the WC-based cemented carbide substrate in a film-growing direction to crystal grain boundaries in a range of 30-200 nm in the titanium carbonitride layer formed by a chemical vapor deposition method, resulting in remarkably suppressed diffusion of substrate components than in conventional hard-coated tools. Accordingly, the present invention provides an extremely-high-performance, long-life insert having higher adhesion of a titanium carbonitride layer to the substrate, suppressed embrittlement of the substrate, and higher chipping resistance and wear resistance than conventional ones in cutting difficult-to-cut alloys such as Ni-based heat-resistant alloys and stainless steels, and a cutting apparatus and an indexable rotary cutting tool comprising such inserts.

(2) In the production method of the hard-coated tool of the present invention, a titanium carbonitride layer is formed directly on the substrate by a chemical vapor deposition method using a starting material gas indispensably comprising $C_2H_6$ having low reactivity to a cemented carbide substrate and $N_2$ suppressing reaction with the substrate, suppressing the diffusion of W, etc., substrate components, to the titanium carbonitride layer, thereby providing a high-performance hard-coated tool.

DESCRIPTION OF SYMBOLS

1 . . . Turning insert substrate (turning insert).
2 . . . Property-evaluating insert substrate (property-evaluating insert).
4 . . . Titanium carbonitride crystal grains.
5 . . . Crystal grain boundaries.
6 . . . Milling insert substrate (milling insert).
7 . . . Indexable rotary tool.
71 . . . Tool body.
72 . . . Tip end portion.
73 . . . Fastening screw.

What is claimed is:

1. A hard-coated tool having a hard coating comprising a titanium carbonitride layer formed directly on a WC-based cemented carbide substrate by a chemical vapor deposition method,
    (a) said titanium carbonitride layer having a composition comprising 74-81% by mass of titanium, 13-16% by mass of carbon and 6-10% by mass of nitrogen;
    (b) said titanium carbonitride layer having a columnar crystal structure comprising columnar crystal grains having an average transverse cross section diameter of 0.01-0.22 µm, when observing a fractured cross section of said titanium carbonitride layer in its growing direction;
    (c) a layer of W diffused from said substrate to said titanium carbonitride layer having an average thickness in a range of 30-200 nm; and
    (d) said titanium carbonitride layer having an X-ray diffraction peak of a (422) plane in a $2\theta$ range of 122.7-123.7°.

2. The hard-coated tool according to claim 1, wherein said titanium carbonitride layer has an average thickness of 1-8 µm.

3. The hard-coated tool according to claim 1, wherein crystal grain boundaries in said W-diffused layer have a composition represented by $(Ti_{x_1}, W_{y_1}, Co_{z_1})(C, N)$, wherein $x_1=0.20-0.75$, $y_1=0.2-0.6$, $z_1=0.05-0.20$, and $x_1+y_1+z_1=1$ by a mass ratio; and crystal grains in said W-diffused layer have a composition represented by $(Ti_{x_2}, W_{y_2}, Co_{z_2})(C, N)$, wherein $x_2=0.55-1$, $y_2=0-0.3$, $z_2=0-0.15$, and $x_2+y_2+z_2=1$ by a mass ratio.

4. The hard-coated tool according to claim 1, which comprises a titanium carbonitride layer having an average thickness of 0.5-4 µm as a second layer directly on said titanium carbonitride layer as the first layer; said second layer having a composition comprising 76-85% by mass of titanium, 10-14% by mass of carbon and 5-10% by mass of nitrogen, and a columnar crystal structure.

5. The hard-coated tool according to claim 1, wherein said hard-coated tool is an insert.

6. A method for producing the hard-coated tool recited in claim 1, which comprises forming said titanium carbonitride layer directly on said WC-based cemented carbide substrate by a chemical vapor deposition method, with a starting material gas comprising a $TiCl_4$ gas, a $N_2$ gas, an $CH_3CN$ gas, an $C_2H_6$ gas, and a $H_2$ gas, at a substrate temperature of 800-880° C.

7. The method for producing a hard-coated tool according to claim 6, wherein said starting material gas comprises 1-3% by volume of a $TiCl_4$ gas, 5-30% by volume of a $N_2$ gas, 0.1-1.5% by volume of an $CH_3CN$ gas, and 0.5-2.5% by volume of an $C_2H_6$ gas, the balance being a $H_2$ gas.

8. The method for producing a hard-coated tool according to claim 7, wherein said starting material gas contains a $CH_4$ gas in a proportion of less than 50% by volume of the $C_2H_6$ gas.

9. The method for producing a hard-coated tool according to claim 6, wherein said starting material gas has pressure of 5-10 kPa.

10. The method for producing a hard-coated tool according to claim 6, wherein a titanium carbonitride layer having a composition comprising 76-85% by mass of titanium, 10-14% by mass of carbon and 5-10% by mass of nitrogen, a columnar crystal structure, and an average thickness of 0.5-4 µm is formed as a second layer directly on said titanium carbonitride layer as the first layer, by a chemical vapor deposition method using a starting material gas comprising a $TiCl_4$ gas, a $N_2$ gas, an $CH_3CN$ gas, and a $H_2$ gas, at a substrate temperature of 800-880° C.

* * * * *